US009595332B2

(12) United States Patent
Georgescu et al.

(10) Patent No.: US 9,595,332 B2
(45) Date of Patent: Mar. 14, 2017

(54) HIGH SPEED, HIGH VOLTAGE TOLERANT CIRCUITS IN FLASH PATH

(71) Applicant: Cypress Semiconductor Corporation, San Jose, CA (US)

(72) Inventors: Bogdan Georgescu, Colorado Springs, CO (US); Cristinel Zonte, Colorado Springs, CO (US); Vijay Raghavan, Colorado Springs, CO (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/859,134

(22) Filed: Sep. 18, 2015

(65) Prior Publication Data
US 2016/0365147 A1 Dec. 15, 2016

Related U.S. Application Data

(60) Provisional application No. 62/175,974, filed on Jun. 15, 2015.

(51) Int. Cl.
G11C 11/34 (2006.01)
G11C 16/08 (2006.01)
(52) U.S. Cl.
CPC .................. *G11C 16/08* (2013.01)
(58) Field of Classification Search
CPC ...................................... G11C 16/08
USPC ....................... 365/185.05, 185.23
See application file for complete search history.

(56) References Cited

U.S. PATENT DOCUMENTS

| 5,506,816 | A | | 4/1996 | Hirose et al. | |
|---|---|---|---|---|---|
| 6,097,636 | A | * | 8/2000 | Nojima | G11C 16/08 365/185.05 |
| 6,288,594 | B1 | * | 9/2001 | Manstretta | G11O 5/143 327/408 |
| 6,570,787 | B1 | | 5/2003 | Wang et al. | |
| 6,687,151 | B2 | * | 2/2004 | Endo | G05F 1/618 365/145 |
| 6,947,328 | B1 | * | 9/2005 | Smidt | G11C 16/06 365/185.11 |
| 7,266,023 | B2 | * | 9/2007 | Shuto | G11C 8/08 365/189.09 |

(Continued)

FOREIGN PATENT DOCUMENTS

CN 103137194 A 6/2013
WO 9636050 A1 11/1996

OTHER PUBLICATIONS

Kyoung-Rok Han, et al., "4-bit/cell SONOS Flash Memory Cell with Recessed Channel Structure", School of Electrical Engineering and Computer Science, Kyungpook National University, Daegu, Korea; 2 pages.

(Continued)

*Primary Examiner* — Viet Q Nguyen
(74) *Attorney, Agent, or Firm* — Lowenstein Sandler LLP

(57) ABSTRACT

A circuit includes a first word line coupled to a non-volatile memory (NVM) cell. A first path includes a first inverter and a transistor. The transistor is coupled to the word line. The first path is coupled to receive a first input voltage signal. A second path includes at least the transistor coupled to the word line. At least a portion of the second path is embedded within the first path. The second path is coupled to receive a second input voltage signal.

17 Claims, 15 Drawing Sheets

(56) References Cited

U.S. PATENT DOCUMENTS

| | | | | |
|---|---|---|---|---|
| 7,345,946 | B1* | 3/2008 | Chapman | G11C 8/08 365/189.11 |
| 7,460,430 | B2* | 12/2008 | Kim | G11C 8/08 365/206 |
| 7,643,372 | B2* | 1/2010 | Yamagami | G11C 8/08 365/189.06 |
| 7,697,367 | B2* | 4/2010 | Hara | G11C 8/10 365/189.05 |
| 7,764,569 | B2* | 7/2010 | Chen | G11C 5/145 365/189.09 |
| 7,940,580 | B2* | 5/2011 | Schreiber | G11C 5/145 365/189.11 |
| 8,144,523 | B2* | 3/2012 | Kobatake | G11C 8/08 365/189.05 |
| 8,570,809 | B2 | 10/2013 | Hirose et al. | |
| 8,755,239 | B2* | 6/2014 | Holla | G11C 11/413 365/154 |
| 8,953,380 | B1 | 2/2015 | Yu et al. | |
| 8,995,219 | B2* | 3/2015 | Romanovskyy | G11C 8/08 365/149 |
| 9,293,179 | B2* | 3/2016 | Wu | H03K 3/35613 |
| 9,466,347 | B1* | 10/2016 | Pasotti | G11C 13/0028 |
| 2003/0072188 | A1* | 4/2003 | Rosendale | G11C 7/1051 365/189.09 |
| 2003/0146741 | A1* | 8/2003 | Endo | G05F 1/618 323/282 |
| 2004/0212014 | A1* | 10/2004 | Fujito | G11C 7/1051 257/355 |
| 2008/0001258 | A1* | 1/2008 | Ema | H01L 21/823892 257/607 |
| 2008/0181025 | A1* | 7/2008 | Ueda | G11C 8/08 365/189.11 |
| 2009/0268527 | A1 | 10/2009 | Duuren et al. | |
| 2010/0039872 | A1* | 2/2010 | Park | G11C 5/147 365/189.11 |
| 2010/0054032 | A1* | 3/2010 | De Sandre | G11C 8/08 365/163 |
| 2012/0218817 | A1* | 8/2012 | Kang | G11C 11/5628 365/185.2 |
| 2012/0320658 | A1 | 12/2012 | Wang et al. | |
| 2014/0016400 | A1 | 1/2014 | Pelley et al. | |
| 2014/0050012 | A1 | 2/2014 | Guillemenet et al. | |
| 2014/0062580 | A1 | 3/2014 | Lee et al. | |
| 2014/0112072 | A1 | 4/2014 | Tsao et al. | |
| 2014/0119120 | A1 | 5/2014 | Lee | |
| 2014/0184300 | A1* | 7/2014 | Wu | H03K 3/35613 327/333 |
| 2014/0204676 | A1* | 7/2014 | Kim | G11C 16/30 365/185.18 |
| 2014/0292377 | A1 | 10/2014 | Gonzalez | |
| 2015/0021679 | A1 | 1/2015 | Tsair et al. | |
| 2015/0071000 | A1* | 3/2015 | Namai | G11C 7/04 365/185.17 |

OTHER PUBLICATIONS

Liyan Jin et al., "Design of DC-DC Converter for Flash Memory IPs", Department of electronic engineering, Chanwon National University, Changwon , South Korea; published Jan. 2013; 4 pages.

International Search Report for International Application No. PCT/US2016/018525 dated May 3, 2016; 2 pages.

Written Opinion of the International Searching Authority for International Application No. PCT/US2016/018525 dated May 3, 2016; 13 pages.

* cited by examiner

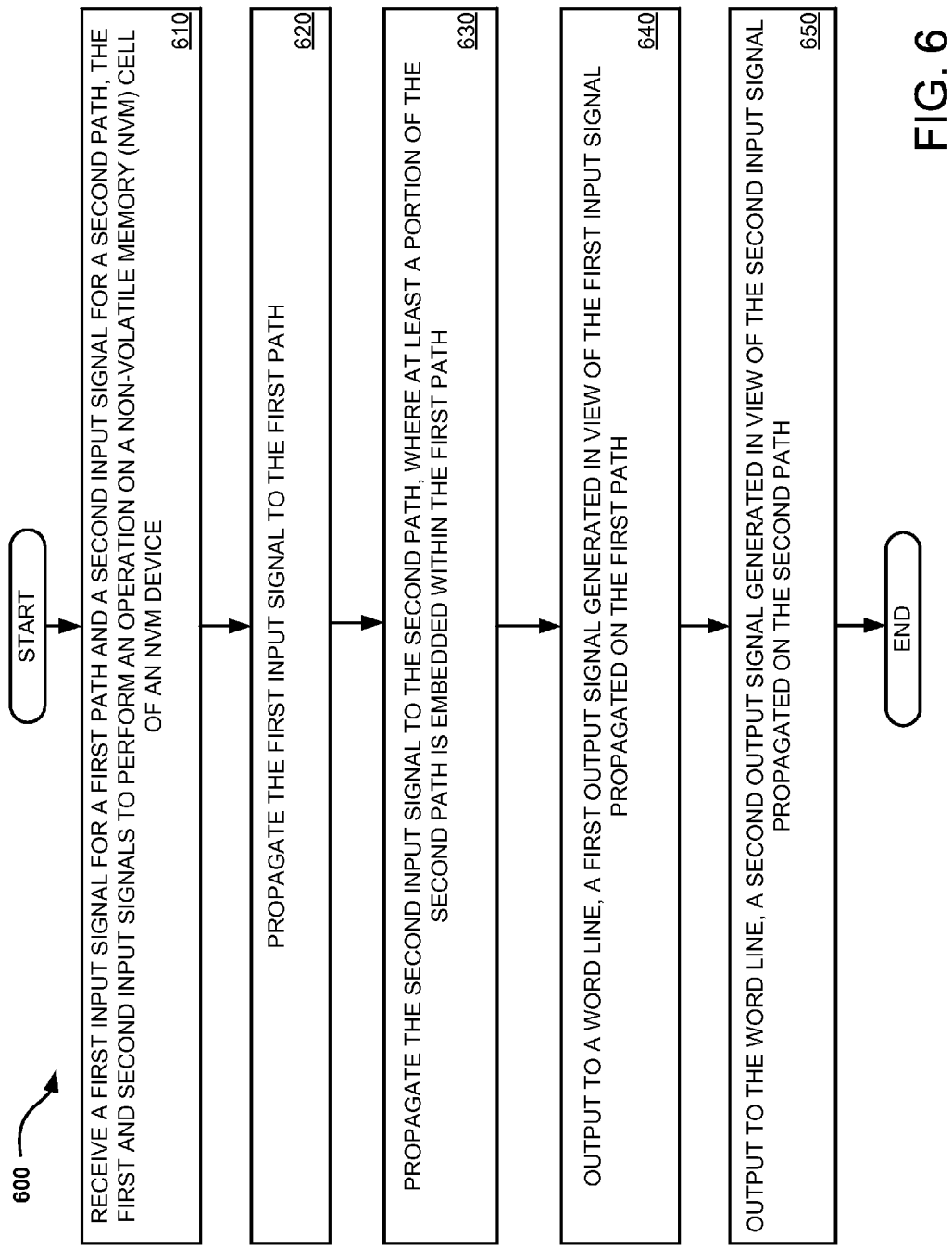

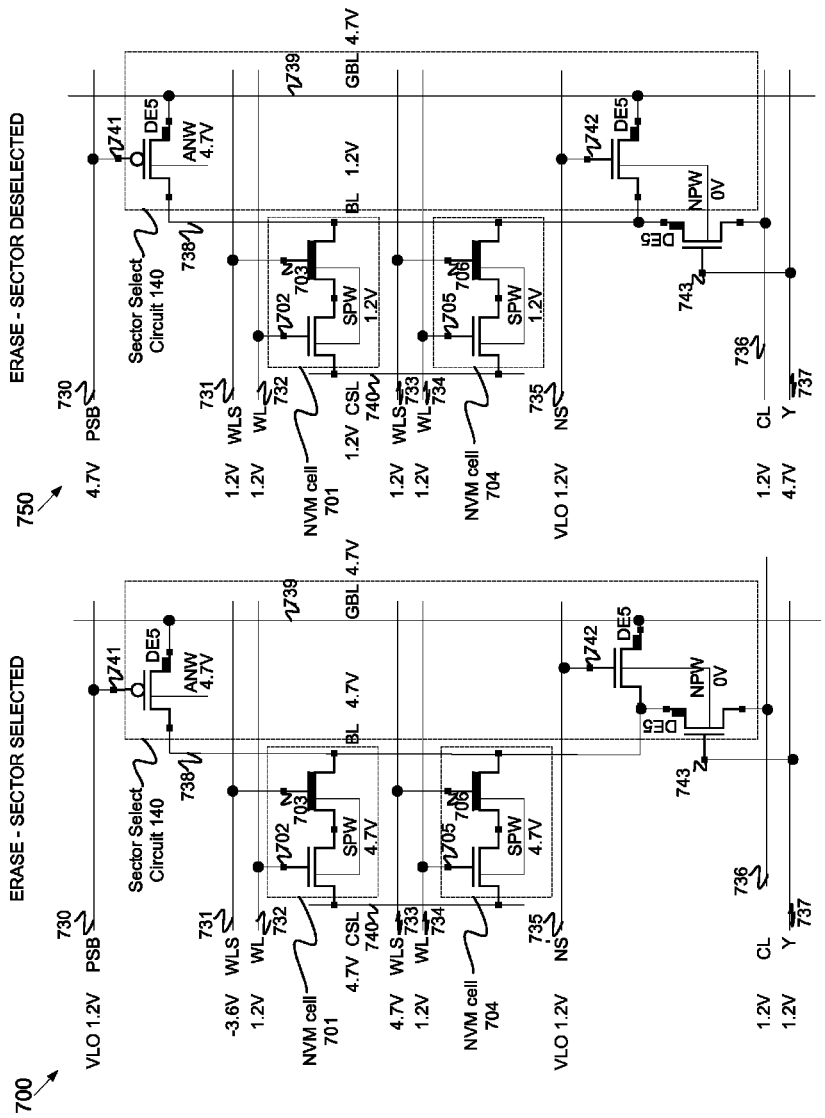

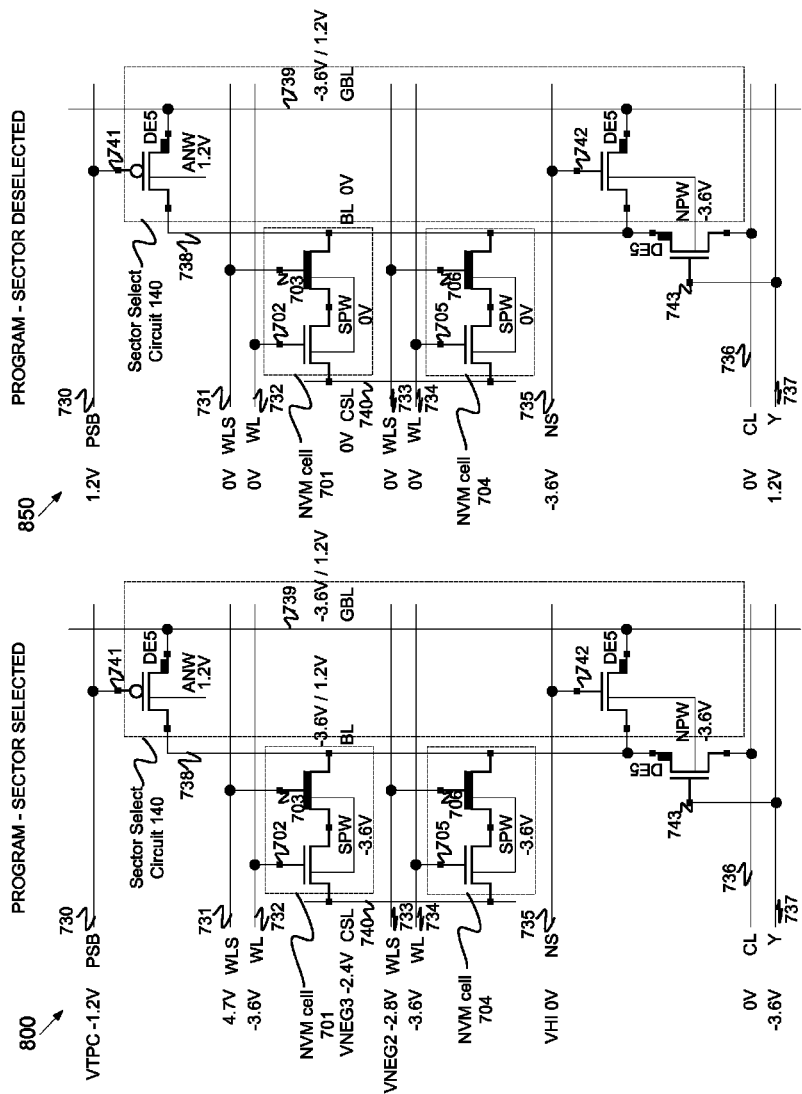

Row-based signals for non-volatile memory (NVM) using common source line (CSL) architecture — 1001

| Line | Erase Operation | | | Program Operation | | | Read Operation | | |
|---|---|---|---|---|---|---|---|---|---|
| | sel sect | sel sect | desel sect | sel sect | sel sect | desel sect | sel sect | sel sect | desel sect |
| | sel row | desel row | | sel row | desel row | | sel row | desel row | |
| WLS | VNEG | VPOS | Vpwr | VPOS | VNEG2 | Vgnd | Vgnd | Vgnd | Vgnd |
| CSL | VPOS | VPOS | Vpwr | VNEG3 | VNEG3 | Vgnd | Vgnd | Vgnd | Vgnd |
| SPW | VPOS | VPOS | Vpwr | VNEG | VNEG | Vgnd | Vgnd | Vgnd | Vgnd |
| WL | Vpwr | Vpwr | Vpwr | VNEG | VNEG | Vgnd | VBST | Vgnd | Vgnd |
| CL | Vpwr | Vpwr | Vpwr | Vgnd | Vgnd | Vgnd | VLIM | VLIM | VLIM |
| NS | VLO | VLO | VLO | VHI | VHI | VNEG | Vgnd | Vgnd | Vgnd |
| PSB | VLO | VLO | VPOS | VTPC | VTPC | vbl | Vpwr | Vpwr | Vpwr |
| ANW | VPOS | VPOS | VPOS | vbl | vbl | vbl | Vpwr | Vpwr | Vpwr |

Column-based signals for non-volatile memory (NVM) using common source line (CSL) architecture — 1002

| Line | Erase Operation | | | Program Operation | | | Read Operation | | |
|---|---|---|---|---|---|---|---|---|---|
| | sel sect | sel sect | desel sect | sel sect | sel sect | desel sect | sel sect | sel sect | desel sect |
| | | | | Program | Inhibit | | sel column | desel column | |
| BL | VPOS | VPOS | Vpwr | VNEG | VBL | Vgnd | VLIM | Vgnd | Vgnd |
| GBL | VPOS | VPOS | VPOS | VNEG | VBL | VNEG/VBL | Vgnd | Vgnd | Vgnd |
| Y | Vpwr | Vpwr | Vpwr | VNEG | VNEG | Vpwr | VBST | Vgnd | Vgnd |

Voltage range of signals — 1003

| VLIM | VPOS | VBST | vbl | VTPC | Vpwr | VNEG | VNEG2 | VNEG3 | VLO | Vgnd | VHI |
|---|---|---|---|---|---|---|---|---|---|---|---|
| 0 to 0.6V | 3.0 to 4.7V | 2 to 3V | 0.5 to 1.2V | -1.8 to -1.1 V | 0.9 to 1.32V | -3.64 to -2.44V | -3 to -2.4 V | -2.8 to -2.1 V | 0V/Vpwr | 0V | Vpw/0V |

FIG. 10

Row-based signals for non-volatile memory (NVM) using common source line (CSL) architecture — 1101

| | Positive Margin Read | | | | Negative Margin Read | | | | Read | | | |
|---|---|---|---|---|---|---|---|---|---|---|---|---|
| | sel sect | | desel sect | | sel sect | | desel sect | | sel sect | | desel sect | |
| | sel row | desel row | | | sel row | desel row | | | sel row | desel row | | |
| WLS | VMARG P | vgnd | vgnd | | VMARG N | vgnd | vgnd | | vgnd | vgnd | vgnd | |
| CSL | vgnd | vgnd | vgnd | | vgnd | vgnd | vgnd | | vgnd | vgnd | vgnd | |
| SPW | vgnd | vgnd | vgnd | | vgnd | vgnd | vgnd | | vgnd | vgnd | vgnd | |
| WL | VBST | vgnd | vgnd | | VBST | vgnd | vgnd | | VBST | vgnd | vgnd | |
| CL | VLIM | VLIM | VLIM | | VLIM | VLIM | VLIM | | VLIM | VLIM | VLIM | |
| NS | vgnd | vgnd | Vpwr | | vgnd | vgnd | Vpwr | | vgnd | vgnd | Vpwr | |
| PSB | Vpwr | Vpwr | Vpwr | | Vpwr | Vpwr | Vpwr | | Vpwr | Vpwr | Vpwr | |
| ANW | Vpwr | Vpwr | Vpwr | | Vpwr | Vpwr | Vpwr | | Vpwr | Vpwr | Vpwr | |

Column-based signals for non-volatile memory (NVM) using common source line (CSL) architecture — 1102

| | Positive Margin Read | | Negative Margin Read | | Read | |
|---|---|---|---|---|---|---|
| | sel sect | desel sect | sel sect | desel sect | sel sect | desel sect |
| | sel column | desel col. | sel column | desel col. | sel column | desel col. |
| BL | VLIM | vgnd | VLIM | vgnd | VLIM | vgnd |
| GBL | vgnd | vgnd | vgnd | vgnd | vgnd | vgnd |
| Y | VBST | vgnd | VBST | vgnd | VBST | vgnd |

Voltage range of signals — 1103

| VLIM | VBST | Vpwr | VMARG P | VMARG N | VLIM | VDD |
|---|---|---|---|---|---|---|
| 0 to 0.6V | 2 to 3V | 0.9 to 1.32V | 0 to 2.5V | -2.5 to 0V | 0 to 0.6V | 1.6 to 3.6V |

FIG. 11

HIGH SPEED, HIGH VOLTAGE TOLERANT CIRCUITS IN FLASH PATH

RELATED APPLICATIONS

This application claims the benefit of U.S. Provisional Application No. 62/175,974, filed on Jun. 15, 2015, the content of which is hereby incorporated by reference herein.

BACKGROUND

Non-volatile memory devices are currently in widespread use in electronic components that require the retention of information when electrical power is not available. Non-volatile memory devices may include read-only-memory (ROM), programmable-read-only memory (PROM), erasable-programmable-read-only memory (EPROM), and electrically-erasable-programmable-read-only-memory (EEPROM) devices. Some memory arrays utilize transistors and gate structures which may include a memory element or charge storage layer. The charge storage layer may be programmed to store data based on voltages applied to or received by the memory array.

Some memory systems use Silicon-Oxide-Nitride-Oxide-Silicon (SONOS) devices as Non-Volatile (NV) storage elements in the NV EEPROM or Flash Memories.

BRIEF DESCRIPTION OF THE DRAWINGS

The present disclosure is illustrated by way of example, and not by way of limitation, in the figures of the accompanying drawings.

FIG. 6 is a flow diagram illustrating a high voltage signal path that is embedded within a low voltage signal path, according to one embodiment.

FIG. 7A illustrates a selected sector of a non-volatile memory array during an erase operation, according to one embodiment.

FIG. 7B illustrates a deselected sector of a non-volatile memory array during an erase operation, according to one embodiment.

FIG. 8A illustrates a selected sector of a non-volatile memory array during a program operation, according to one embodiment.

FIG. 8B illustrates a deselected sector of a non-volatile memory array during a program operation, according to another embodiment.

FIG. 10 are tables illustrating voltage biases for erase, program, and read operations performed on a non-volatile memory device, according to one embodiment.

FIG. 11 are tables illustrating voltage biases for positive margin read, negative margin read, and read operations performed on a non-volatile memory device, according to one embodiment.

DETAILED DESCRIPTION

Figure 1:
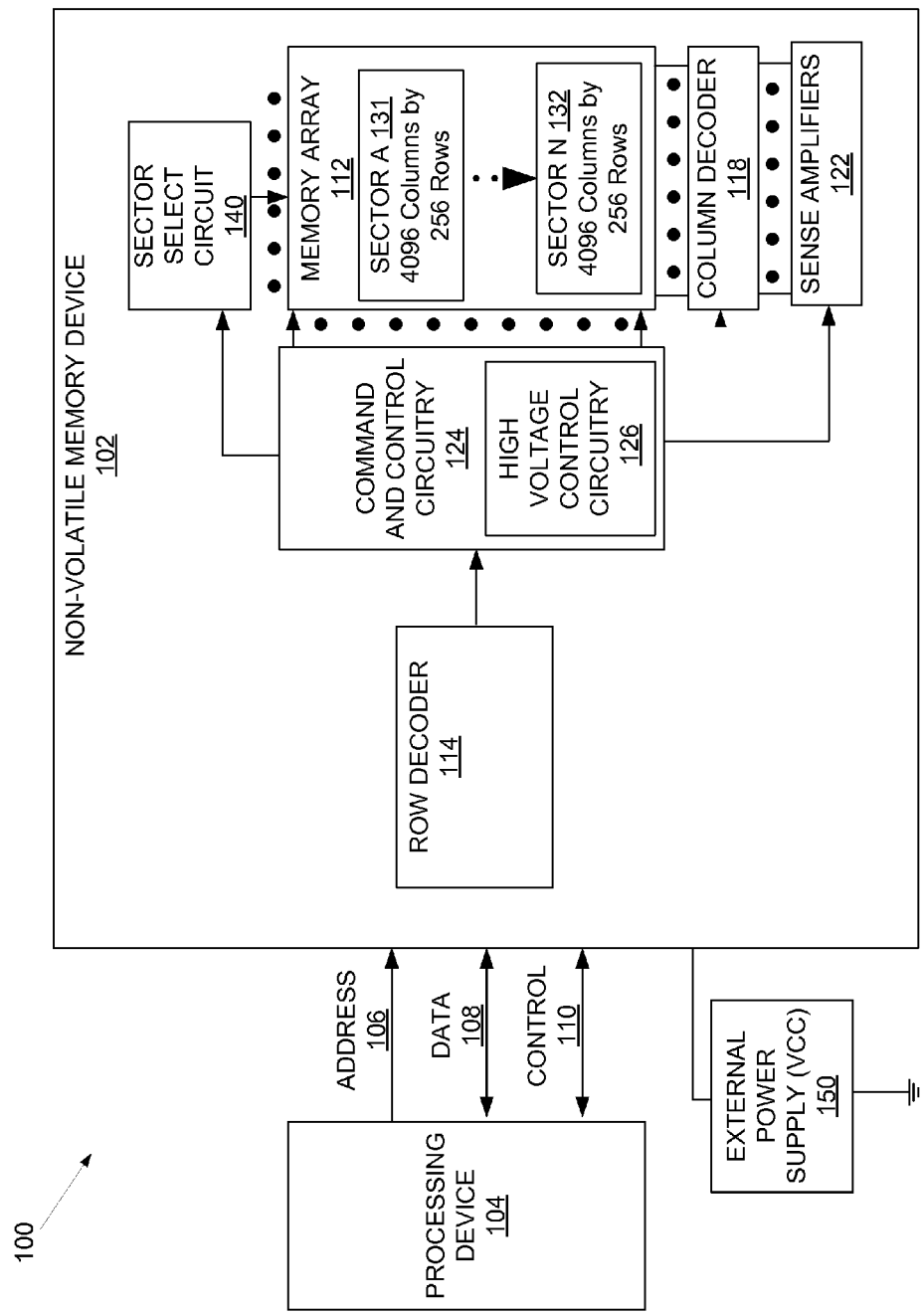
FIG. 1 is a block diagram illustrating a first non-volatile memory system, according to an embodiment.

High voltage (HV) signals and low voltage (LV) signals may be used in the operation of non-volatile memory (NVM) devices, such as flash memory. HV signals may be voltage signals that are above a highest voltage of a power supply of a NVM device or below a lowest voltage of a ground supply of a NVM device. For example, HV signals of 8.3 volts (V) may be required to program a NVM cell while the power supply of the NVM device is around 1.2V (e.g., highest voltage). LV signals may be voltage signals that are at or below a highest voltage of the power supply of the NVM device and at or above a lowest voltage of the ground supply of the NVM device. In other words, LV signals may be within a range of the power supply and all signals out of the range of the power supply may be HV signals.

Some NVM arrays may use dedicated source line (DSL) architecture. DSL architecture may include dedicated source lines for each column of NVM cells in an NVM array (or each column of NVM cells in an NVM sector of an NVM array). DSL architecture may dedicate a first path to HV signals and a second path to LV signals. The paths are separate from one another and HV signals traverse a separate path than LV signals. As separate, non-overlapping components may be dedicated to HV signals and LV signals, the components may take up a large amount of space on the NVM device.

Common source line (CSL) architecture allows for shared source lines between a plurality of rows and/or columns of NVM cells. For example, CSL architecture may share a CSL between substantially all the NVM cells in a sector of NVM cells. In other examples, CSL architecture may share a CSL between substantially all the NVM cells in an NVM array, or one or more rows and/or two or more columns of NVM cells in an NVM sector or array. The implementation of CSL architecture allows for a reduction of silicon area used for each memory cell.

CSL architecture allows for HV signals and LV signals to share at least a portion of components. The HV signals traverse a path that is at least partially embedded in a path that LV signals traverse. Thus, HV and LV signals may not traverse completely separate paths and the sharing of at least some components between the overlapping HV and LV signal paths may provide a further reduction in silicon area space for NVM.

Designers implementing CSL architecture in a memory device may need to take additional care to control the application of high voltage signals and to maintain the safe operation area (SOA) of the transistors.

The present disclosure addresses the above-mentioned and other deficiencies of separate HV and LV signal paths that may utilize extra silicon area in an NVM device.

In one embodiment, an NVM cell is coupled to a CSL shared with NVM cells of a sector. An NVM cell may be a unit of memory capable of storing a single data value (e.g. a single bit, such as a logical "0" or logical "1"). A sector or NVM sector may be a block of a NVM array containing a plurality of NVM cells (i.e., a plurality of rows of NVM cells and a plurality of columns of NVM cells). A memory array may include one or more sectors. A word line may be coupled to an NVM cell. The word line is propagated based on an operation to be performed on the NVM cell. Examples of operation include a read operation, a program operation, or an erase operation. A word line driver for rows of the NVM cell includes two paths—one for fast-LV signals and another for slow-HV signals. The first path, which is coupled to receive a first input voltage signal (e.g., fast-LV signal for a read operation), includes various components including transistors. One of the transistors is coupled to the word line. The second path, which is coupled to receive a second input voltage signal (e.g., fast HV signal for a program operation), also includes various components including transistors. The second path includes at least the one transistor that is coupled to the word line. Thus, at least a portion of the second path is embedded within the first path.

HV signals applied to some transistors in a NVM device may cause those transistors to operate outside a safe operating area (SOA) which, in turn, may result in damage to the transistors and the NVM device. Safe operating area may be defined by a set of voltage differentials between the different terminals (e.g., gate to drain, gate to source, gate to bulk, or source to drain) of a transistor that allow the transistor to meet lifetime reliability specifications, and/or the set of voltage differentials between different terminals of a transistor within which the transistor may be biased without damaging the transistor. For example, in order to stay in the SOA, the gate-to-drain voltage of some transistors may not exceed 3.6V. Great care must be taken by circuit designers to control the application of HV signals in a NVM device to keep the transistors in the SOA and avoid transistor damage.

FIG. 1 is a block diagram illustrating a non-volatile memory system, according to an embodiment. NVM system 100 may include a processing device 104 coupled to NVM device 102 via address bus 106, data bus 108, and control bus 110. It will be appreciated by those skilled in the art that the NVM system 100 has been simplified for the purpose of illustration, and not intended to be a complete description. In particular, details of the processing device 104, row decoder 114, column decoder 118, sense amplifiers 122, and command and control circuitry 124, are not described in detail herein. It should be appreciated that NVM system 100 may include all, some, or more components than illustrated in FIG. 1.

External power supply 150, also referred to as power supply, is coupled to NVM device 102. External power supply 150 may be a power supply external to NVM device 102 and may be used by NVM device 102 to generate HV signals that are above the highest voltage of the external power supply 150 or below a lowest voltage of the external ground supply 150. For example, external power supply 150 may supply voltages around 1.2V. The HV signals may be below 0V or above 1.2V. For purpose of illustration, and not limitation, the following figures, with respect to HV signals, will be described as having an external power supply voltage of 1.2V and an external ground supply of 0V, unless otherwise stated. It should be appreciated that different power supply voltage ranges may also be provided, for example 0V to 3V.

Processing device 104 may reside on a common carrier substrate such as, for example, an integrated circuit ("IC") die substrate, a multi-chip module substrate, or the like. Alternatively, the components of processing device 104 may be one or more separate integrated circuits and/or discrete components. In one exemplary embodiment, processing device 104 is the Programmable System on a Chip (PSoC®) processing device, developed by Cypress Semiconductor Corporation, San Jose, Calif. Alternatively, processing device 104 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

NVM device 102 includes memory array 112, such as NVM array, organized as rows and columns of non-volatile memory cells (not shown in this figure) as described below. Memory array 112 is coupled to row decoder 114 and/or command and control circuitry 124 via multiple select lines and read lines (at least one select line and one read line for each row of the memory array). Memory array 112 is further coupled to column decoder 118 via multiple bit lines 120 (one each for each column of the memory array). Memory array 112 may be coupled to multiple sense amplifiers 122, via column decoder 118, to read multi-bit words therefrom. NVM device 102 further includes command and control circuitry 124 to receive signals from processing device 104 and sends signals to row decoder 114, control column decoder 118, sense amplifiers 122, control sector select circuit 140, and control HV signals applied to memory array 112. Command and control circuitry 124 includes high voltage control circuitry 126 to generate and control the HV signals for operation of NVM device 102, which may be routed through high voltage control circuitry 126 to column decoder 118, sense amplifiers 122, and/or sector selector circuit 140. High voltage control circuitry 126 operates to apply appropriate voltages, including HV signals and LV signals, to the memory cells during read, erase, pre-program, and program operations.

Command and control circuitry 124 may be configured to select a first row of memory array 112 for a program operation by applying a voltage to a first select line in the first row and to deselect a second row of the memory array by applying another voltage to a second select line in the second row. Command and control circuitry 124 may be further configured to control column decoder 118 to select a memory cell in the first row for programming by applying a voltage to a first bit line in a first column, and to inhibit another memory cell in the first row from programming by applying another voltage to a second bit line in a second column. Command and control circuitry 124, in particular high voltage control circuitry 126, may be further configured to apply a voltage to one or more common source lines that may be coupled to memory cells included in memory cell array 112 as described below.

NVM device 102 may be a storage device configured to store data values in various low-power and non-volatile contexts. For example, NVM device 102 may be included in a small area flash memory which may be implemented in devices or systems such as smart cards or bank cards. Accordingly, memory devices as disclosed herein, such as NVM device 102, may be implemented to have a relatively small area which may be fabricated using advanced processing nodes, such as a 65 nm node or lower. Moreover, as discussed in greater detail below, NVM device 102 may include various memory cells (not shown) configured to store data values. The memory cells may be implemented with a common source line to reduce the overall footprint of each memory cell. Each memory cell may also be compatible with Fowler-Nordheim programming techniques.

Memory array 112 may include one or more NVM sectors, such as sector A 131 though sector N 132. Each sector may have any number of rows and columns of NVM cells, for example 4096 columns and 256 rows. Rows may include multiple NVM cells arranged horizontally. Columns may include multiple NVM cells arranged vertically. Memory array 112 may use a global bit line (GBL) shared by all the sectors of memory array 112. Each column of memory array 112 may have a GBL. For example, a particular GBL for column 0 shared by all of the sectors (e.g., sector A 131 through sector N 132) will be coupled to each row of memory array 112 in column 0 of the selected sector through the sector select circuit. The GBL is configured to provide HV signals to the sectors of memory array 112 during program operations and erase operation, while during read operations, the GBL is configured to provide LV signals.

Memory array 112 may use sector select circuit 140 to couple GBL to an associated bit line (BL) of a column of a particular sector. Each column in a sector may have an associated BL particular to that sector that is not shared by other sectors. Each column in a sector may have a sector select circuit 140 to selectively couple the GBL to the associated BL. For example, a sector select circuit 140 for column 0 of sector A 131 may be used as a switch to couple the voltage signal on GBL of column 0 of memory array 112 to the BL for column 0 of sector A 131 during erase operations and program operations. There may be a sector select circuit 140 for each of the Sector A 131 to Sector N 132.

Memory array 112 may also use column decoder 118 to couple a column of NVM cells in a sector to sense amplifiers 122 during a read operation. For example, a column decoder 118 for column 0 of sector A 131 may be used as a switch to couple the NVM cells of column 0 of sector A to sense amplifiers 122 during a read operation. Sense amplifiers 122 may be attached to every sector or, in order to save area, they may be shared by two adjacent sectors.

It should be appreciated that terms "rows" and "columns" of a memory array are used for purposes of illustration, rather than limitation. In one embodiment, rows are conventionally arranged horizontally and columns are conventionally arranged vertically. In another embodiment, rows and columns of memory array 112 may be arranged in any orientation.

In one embodiment, a NVM cell may be a two transistor (2T) memory cell. In a 2T memory cell, one transistor may be a memory transistor, while another transistor may be a pass transistor. In other implementations the NVM cell may include another number of transistors, such as a single memory transistor (1T). NVM cells, such as NVM cell 701 and 704 of FIG. 7A, will be discussed below in regards to at least FIGS. 7A-9B.

Memory array 112 may be implemented using charge trapping memory transistors. Charge trapping memory transistors may be implemented to utilize transistors and gate structures that include a charge trapping layer. The charge trapping layer may be an insulator that is used to trap charge. The charge trapping layer may be programmed to store data based on voltages applied to or received by the memory array 112. In this way, a memory array 112 may include various different NVM cells arranged in rows and columns, and each NVM cell may be capable of storing at least one data value (e.g., bit). Voltages may be applied to each of the NVM cells to program the NVM cell (e.g., program operation), erase the NVM cell (e.g., erase operation), or read the NVM cell (e.g., read operation).

In one embodiment, the charge trapping memory transistors may be implemented using different materials. One example of a charge trapping memory transistor is a silicon-oxide-nitride-oxide-silicon (SONOS) type transistor. In a SONOS type transistor, the charge trapping layer of the memory transistor may be a nitride layer, such as a layer of silicon nitride. Moreover, the charge trapping layer may also include other charge trapping materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, or a high-K layer. The charge trapping layer may be configured to reversibly trap or retain carriers or holes injected from a channel of the memory transistor, and may have one or more electrical characteristics reversibly changed, modified, or altered based on voltages applied to NVM cell. In another embodiment, different types of charge trapping memory transistors may be used. For purposes of illustration, and not limitation, the operation of NVM cells in the disclosure will be described with respect to a SONOS type transistor. It should be appreciated that other types of NVM transistors may be implemented using the disclosure herein.

Figure 2:
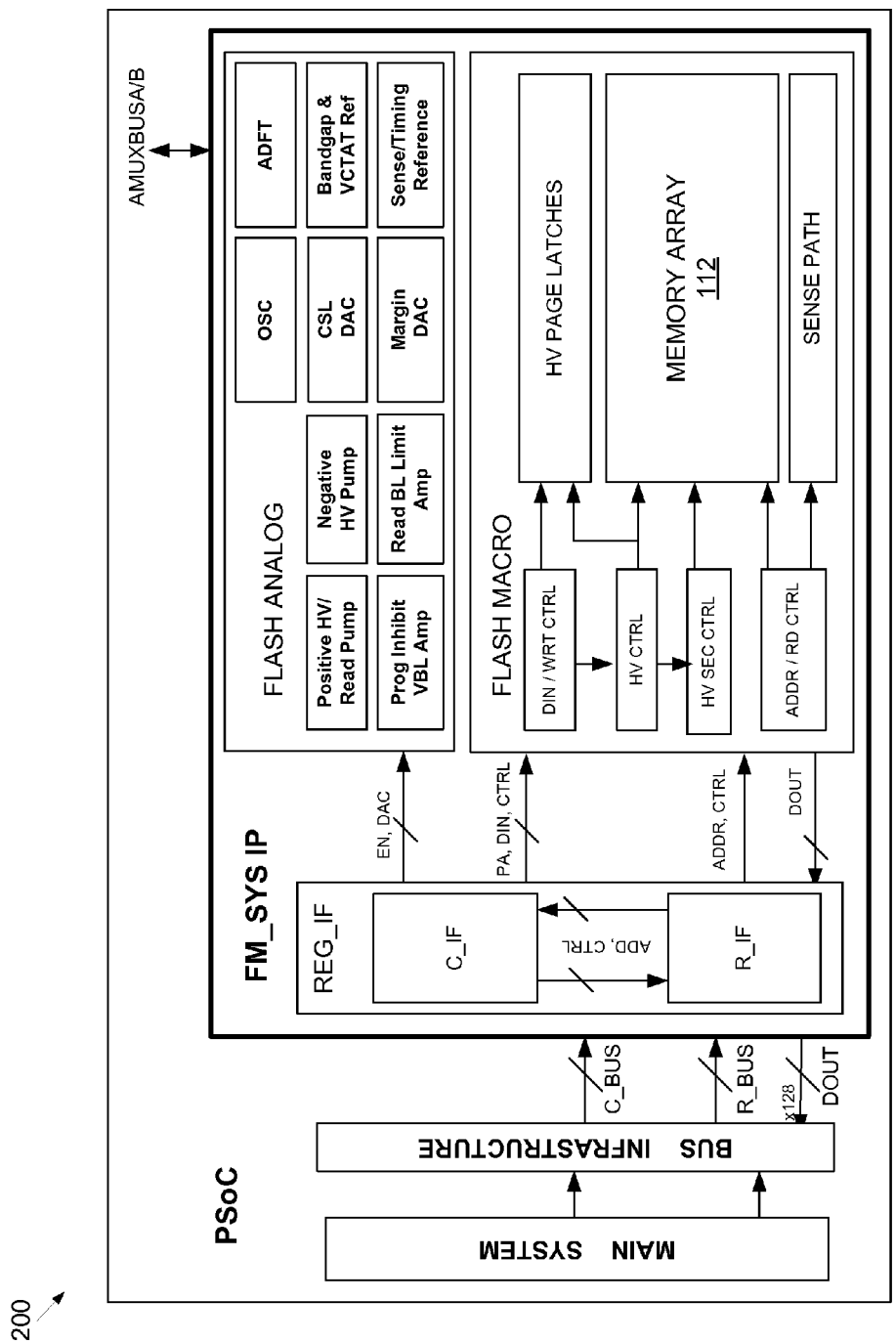
FIG. 2 is a block diagram illustrating a second non-volatile memory system, according to an embodiment.

FIG. 2 is a block diagram illustrating a non-volatile memory system, according to another embodiment. Circuit 200 is another NVM system in which the current disclosure may operate.

Figure 3:
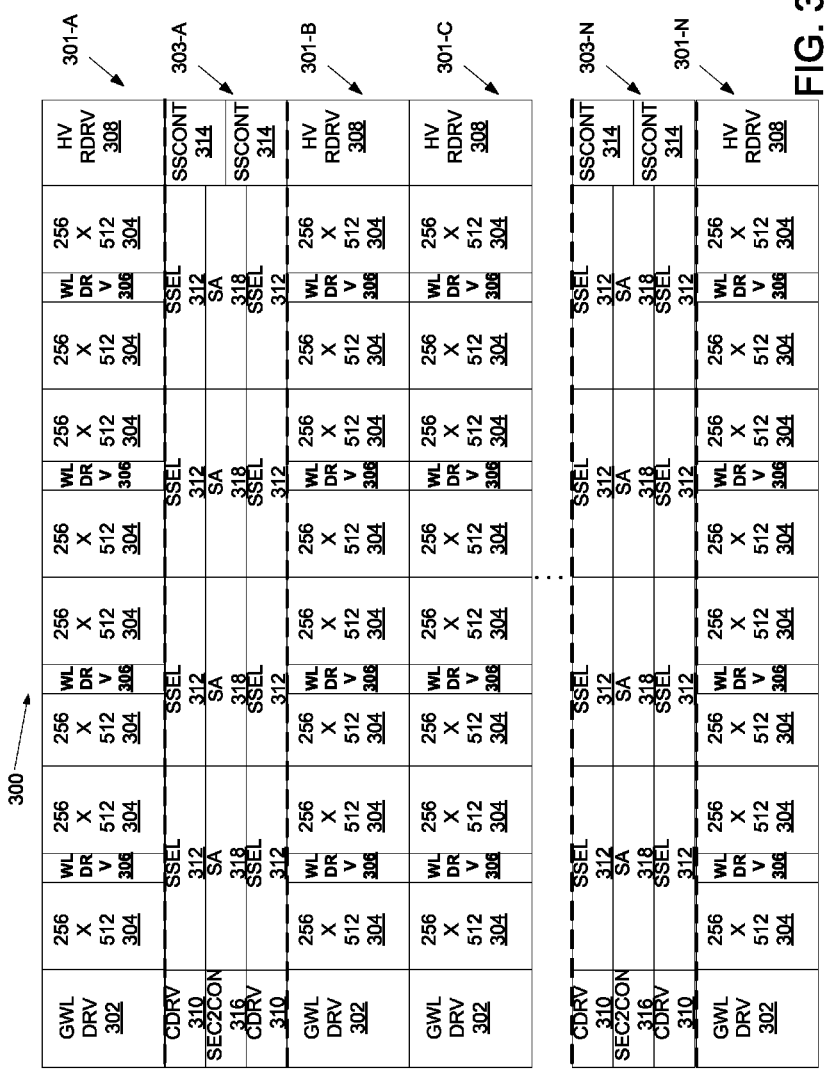
FIG. 3 illustrates non-volatile memory array, according to one embodiment.

FIG. 3 illustrates non-volatile memory array, according to one embodiment. The non-volatile memory array 300 includes various functional blocks and respective (physical) locations of the functional blocks. A first sector 301-A includes a Global Word Line Driver (GWLDRV) 302, eight 256×512 arrays 304, four distributed word line driver (WL-DRVs) 306, and a high voltage row driver (HVRDRV) 308. Each of the array 304's size is 256 rows by 512 columns. The array size provided is for exemplary purposes and other array sizes may be used. For the first sector 301-A, the total arrays combined have a total of 4096 columns. For each sector, one GWLDRV 302 provides signals to all other components. Each WLDRV 306 performs operations for adjacent 256×512 arrays 304. In an implementation, by performing operations for adjacent arrays, each of the WLDRVs 306 may reduce their load instead of one WLDRV 306 performing operations for all arrays. The load of each of the WLDRV 306 may be reduced and thus, signals may propagate faster (as the arrays may be segmented). Each of the WLDRV 306 may have common inputs, however, the outputs of each WLDRV 306 are independent of each other. The GWLDRV 302 is thus coupled to each of the WLDRV 306 in a sector and control each WLDRV 306.

A first spine 303-A includes a set of sector select controls (SSCONTs) 314 and 314. The first spine 303-A also includes a total of eight sector selects (SSEL 312), four sense amplifiers (SAs) 318, two column drivers (CDRV) 310, and a SEC2CON 316. The SEC2CON 316 is a sector X2 control. The SEC2CON 316 may be common for two adjacent sectors, as shown in FIG. 3. Controlling signals for the memory array may be located in SEC2CON 316. The signal source in FIG. 14 (described below) may be located in SEC2CON 316. Additionally, the LV logic 408 block which generates the RNG 414 signal and VNEG_C_S 514 (in FIGS. 4 and 5) are placed in SEC2CON 316. The SSCONT 314 generates and provides control signals to SSEL 312.

Additional sectors 301-B, 301-C, . . . , 301-N and spine 303-N are included in the memory array 300. In an implementation, a total of eight sectors may be included in the memory array 300. However, additional or fewer sectors and/or spines may be included in the memory array 300. In the memory array 300, a spine separates a set of sectors. In this embodiment, SA 318 can be shared between a pair of sectors 301.

In an implementation, HV signals are transmitted by an HV controller (not shown). The HV controller receives the HV signals from Vpositive and Vnegative charge pumps (not shown) and the HV controller distributes the HV signals. The HV controller may be located on the topmost, rightmost corner of the non-volatile memory array 300. The HV controller may communicate HV signals to HVRDRV 308 in sector 301-A. The HV signals are transmitted from HVRDRV 308 in sector 301-A to SSCONT 314 in spine 303A. The signal then propagates from SSCONT 314 to SSEL 312 in spine 303-A and continues to propagate from the right to left within the array.

LV signals are transmitted by a LV controller (not shown). The LV controller may be located at the bottommost, leftmost corner of the non-volatile memory array 300. The LV controller may communicate LV signals to GWLDRV 302 and to CDRV 310 in sectors 301-A, 301-B, . . . , 301-N. The LV signals are transmitted from GWLDRV 302 in sector 301-A to WLDRV 306 in sector 301A. Other LV signals are transmitted from CDRV 310 to SSEL 312 in spine 303-A and continue to propagate from the left to right within the array. In an implementation spine 303 is also referred to as a sector spine.

In an implementation, GWLDRV 302 and one or more of WLDRV 306 when combined together may form a word line driver for a pass transistor.

In an implementation, a maximum of 128 sense amplifiers in FIG. 3 be read at the same time.

Figure 4:
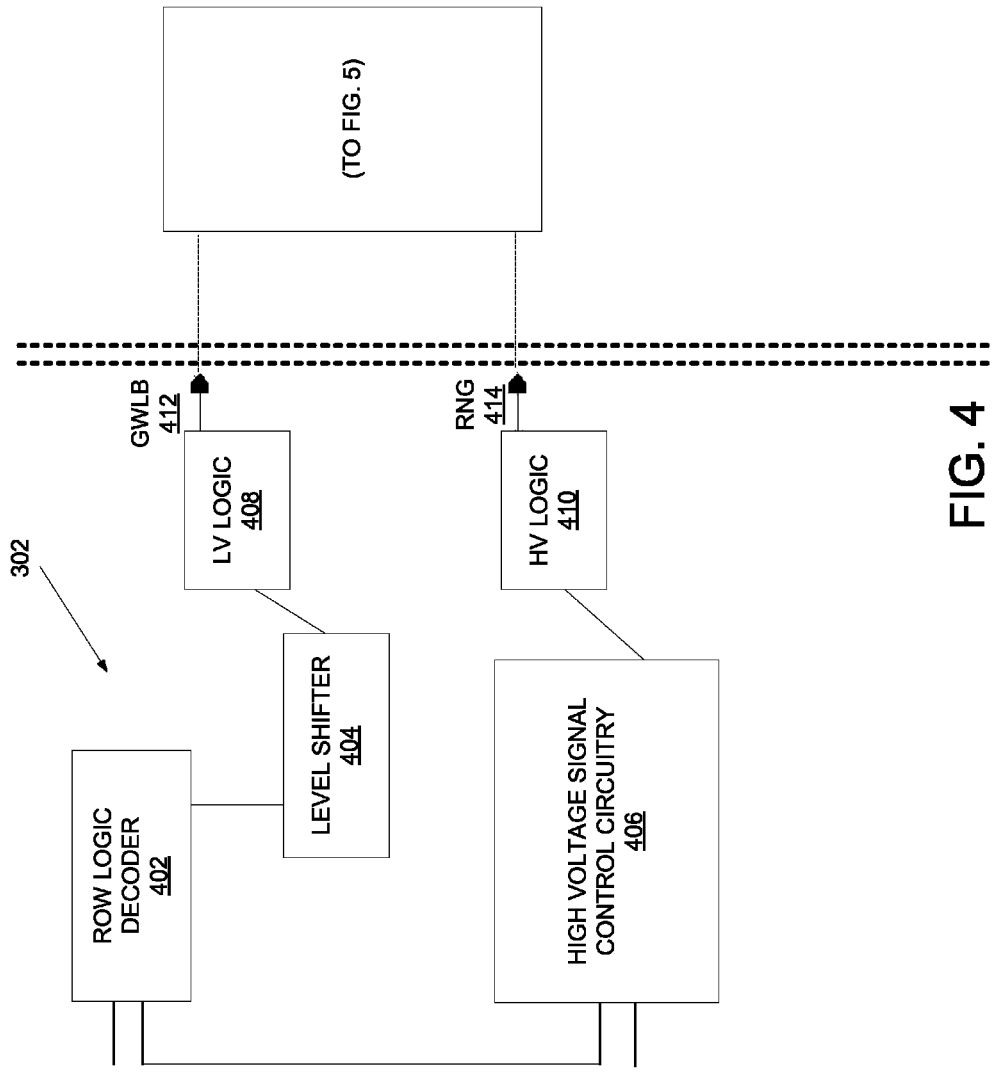
FIG. 4 illustrates a global word line driver, according to one embodiment.

Details regarding the GWLDRV 302 are described in FIG. 4. Details regarding WLDRV 306 are described in FIG. 5. Details regarding SSEL 312 are described in FIGS. 7A-9B. Details regarding CDRV 310 are described in FIG. 13.

FIG. 4 illustrates a global word line driver, according to one embodiment. GWLDRV 302 may be one of the global word line drivers (GWLDRV) 302 depicted in FIG. 3.

GWLDRV 302 includes a row logic decoder 402, a level shifter 404, high voltage signal control circuitry 406, low voltage (LV) logic 408, and high voltage (HV) logic 410. LV logic 408 generates a signal called GWLB 412. HV logic 410 generates a signal called row N-gate control signal (RNG) 414. Each of signals GWLB 412 and RNG 414 may be transmitted to FIG. 5, as depicted. The double-lines in FIG. 4 indicate that other components may be physically located in between GWLDRV 302 and WLDRV 306 shown in FIG. 5. Referring back to FIG. 3, one or more components such as array 304 or WLDRV 306 may be physically located between GWLDRV 302 in FIG. 4 and WLDRV 306 in FIG. 5. Even though other components may be placed in between FIG. 4 and FIG. 5, signals GWLB 412 and RNG 414 are output by GWLDRV 302 and input into WLDRV 306.

LV signals are input into the row logic decoder 402 and LV and HV signals are input into the high voltage signal control circuitry 406. Command and control circuitry 124 and high voltage control circuitry 126 in FIG. 1 provides the LV signals as input(s) to the row logic decoder 402 in FIG. 4 if a LV path is active. If an HV path is active, the command and control circuitry 124 and high voltage control circuitry 126 in FIG. 1 provides the HV signals as input(s) to the high voltage signal control circuitry 406 in FIG. 4. For the LV signal path, the signals travel through the row logic decoder 402, the level shifter 404, and the LV logic 408 before outputting to the circuitry in FIG. 5. The level shifter 404 is coupled to the LV logic 408 and the row logic decoder 402. For an HV signal path, the signals travel through the high-voltage signal control circuitry 406 and the HV logic 410 before outputting to the circuitry in FIG. 5. The high-voltage signal control circuitry 406 is coupled to the HV logic 410. The row logic decoder 402 is configured to output LV signals to the LV logic 408, via the level shifter 404. The high-voltage signal control circuitry 406 is configured to output HV signals to the HV logic 410. In an implementation, a common line is shown between the row logic decoder 402 and the high voltage control circuitry 406. The common line may be optional, in an implementation. The inputs of the row logic decoder 402 and the high voltage signal control circuitry 406 may have a commonality, but the commonality may be at the inputs. The input at the common line will either propagate through a LV signal path or a HV signal path. The input may have two different states and when the LV signal state is active, the signal propagates the LV signal path and when the HV signal state is active, the signal propagates the HV signal path. The command and control circuitry 124 and high voltage control circuitry 126 in FIG. 1 determines which path is active (either a HV path or an LV path based on the signals transmitted to the row logic decoder 402 or the high voltage control circuitry 406). The status of the inputs of either the row logic decoder 402 or the high voltage control circuitry 406 may determine whether a HV path or a LV path is active.

The command and control circuitry 124 and high voltage control circuitry 126 in FIG. 1 may determine that a signal is HV if the signal is a voltage signal above a highest voltage of a power supply of the NVM device 102 or below a lowest voltage of a ground supply of the NVM device 102. The command and control circuitry 124 and high voltage control circuitry 126 then provide the HV signal to the high voltage signal control circuitry 406 in FIG. 4. HV logic 410 may propagate the HV signal on an appropriate HV signal path. If the signal is a voltage signal that is at or below a highest voltage of the power supply of the NVM device 102 and at or above a lowest voltage of the power supply of the NVM device 102, the command and control circuitry 124 and high voltage control circuitry 126 may determine that the signal is LV. The command and control circuitry 124 and high voltage control circuitry 126 then provide the LV signal to the row logic decoder 402 in FIG. 4. The level shifter 404, via LV logic 408, may propagate the LV signal on an appropriate LV signal path.

If a LV signal is provided by the row logic decoder 402 to the level shifter 404, the level shifter boosts the LV signal from Vcc to Vboost range. The level shifter 404 then provides the boosted signal to LV logic 408. The output of the LV logic 408 is the boosted signal, which is called GWLB. LV logic 408 prepares the GWLB signal for submission to WLDRV 306 in FIG. 5.

If a HV signal is provided by the high voltage control circuitry 406 to the HV logic 410, the HV logic 410 outputs the HV signal which is called RNG 414. HV logic 410 prepares the RNG 414 signal for submission to the WLDRV 306 in FIG. 5.

Figure 5:
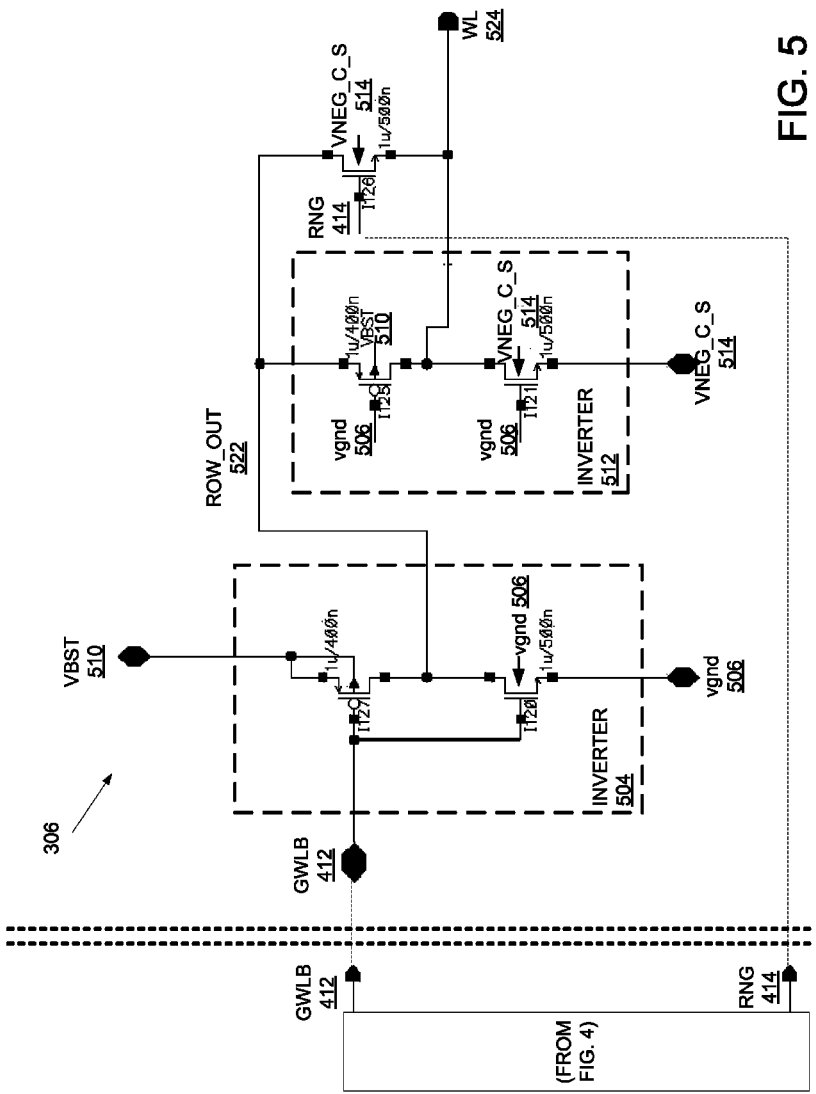
FIG. 5 illustrates a distributed word line driver, according to one embodiment.

FIG. 5 illustrates a distributed word line driver, according to one embodiment. FIG. 5 includes transistors that may be 4-terminal transistors including a gate, source, drain, and bulk. The transistors may be N-channel metal oxide semiconductor field-effect transistors (nMOSFETs or "NMOS") or P-channel metal oxide semiconductor field-effect transistors (pMOSFETs or PMOS")

The distributed word line driver circuit in FIG. 5 may be used in conjunction with NVM device 102 implementing CSL architecture. In FIG. 4, the LV logic 408 partly decodes low voltage (LV) signals (i.e., within the range of the ground and power supply, e.g., 0V to 1.2V) and the HV logic 410 partly decodes high voltage (HV) signals (out of range of the power supply).

The WLDRV 306 receives at a first input, the GWLB 412 signal and at a second input, the RNG 414 signal. A first path (e.g., a fast-LV path) is coupled to the first input and a second path (e.g., a slow-HV path) is coupled to the second input. The first input is configured to receive a fast-LV signal that propagates through the first path to read a cell of NVM device 102. The second input is configured to receive a slow-HV signal that propagates through the second path to program the cell.

In FIG. 5, the WLDRV 306 may be one of the distributed word line drivers (WLDRV) 306 depicted in FIG. 3. The WLDRV 306 includes an inverter 504, inverter 512, and an NMOS 1126. The WLDRV 306 also includes an output word line (WL) 524. Each of the inverters 504 and 512 include a complementary pair of MOSFETs. The inverter 504 includes a PMOS 1127 and an NMOS 1120. The inverter 512 includes a PMOS 1125 and an NMOS 1121. In each of the inverters 504 and 512, the drains of each set of NMOS and PMOS are coupled to each other. The drains of NMOS and PMOS in the inverter 512 are also coupled to a source of the PMOS 1127 and a source of the NMOS 1126. The inverter 504 and the inverter 512 may also be referred to as complementary metal-oxide semiconductors (CMOSs) having an NMOS and PMOS.

In the inverter 504, a source of the NMOS 1120 is coupled to vgnd 506. A source of the PMOS 1127 is coupled to a VBST 510 signal. Thus, the inverter 504 is biased by the VBST 510 signal and the vgnd 506 signal. A gate of the NMOS 1120 as well as a gate of the PMOS 1127 is coupled to the GWLB 412 signal. Both gates are also coupled to one another. A well of the NMOS 1120 is biased by vgnd 506. A well of the PMOS 1127 is biased by the source of PMOS 1127, which is coupled to the VBST 510 signal.

In an implementation, the VBST 510 signal may be the internal power supply.

In the inverter 512, a source of the NMOS 1121 is coupled to VNEG_C_S 514. A source of the PMOS 1125 is coupled to a node, ROW_OUT 522, which is also coupled to the drain of the NMOS 1120, the drain of the PMOS 1127, and the drain of the NMOS 1126. The inverter 512 is biased by VNEG_C_S 514 and ROW_OUT 522.

Both gates of the NMOS 1121 and PMOS 1125 are coupled to vgnd 506. The gates may also be coupled to one another. A drain of the PMOS 1125 may be coupled to the WL 524. A drain of the NMOS 1121 is coupled to the WL 524. A source of the NMOS 1121 is coupled to VNEG_C_S 514. A well of the NMOS 1121 is biased by VNEG_C_S 514. A well of the PMOS 1125 is biased by VBST 510.

A gate of NMOS 1126 is coupled to the RNG 414 signal. A source of NMOS 1126 is coupled to WL 524. A well of the NMOS 1126 is biased by VNEG_C_S 514.

The WLDRV 306 provides one driver (WLDRV 306) for handling paths taken by HV signals as well as LV signals.

In an implementation, a LV signal path includes the LV logic 408 in FIG. 4, and the inverter 504, the inverter 512, and the NMOS 1126 in FIG. 5, where output is propagated on WL 524. A HV signal path includes the HV logic 410 in FIG. 4, the inverter 512 and the NMOS 1126 in FIG. 5, where an output is provided on WL 524.

For the LV signal path, the GWLB 412 signal may be low for an operation (such as a read operation) to be performed on a selected sector with an active word line. No operation is performed on a deselected sector, or a selected sector where the word line is not selected. Therefore, the GWLB 412 signal may be high. The RNG 414 signal may be high for the operation performed on the selected sector, active word line or the deselected sector or selected sector where the word line is not selected. The NMOS 1126 may also be on because the RNG 414 signal is high. However, for the operation performed on the selected sector, active word line, VDS is at zero volts. For the operation performed on the selected sector, active word line, PMOS 1127 is on, NMOS 1120 is off, PMOS 1125 is on and NMOS 1121 is off. For the operation performed on the deselected sector or selected sector where the word line is not selected, PMOS 1127 is off, NMOS 1120 is on, PMOS 1125 is off and NMOS 1121 is off. In both operations, ROW_OUT 522 propagates to onto WL 524. Details regarding the propagation of ROW_OUT 522 onto the WL 524 for the operation performed on the selected sector, active word line and the operation performed on the deselected sector or selected sector where the word line is not selected are described herein below.

The LV signal path in the WLDRV 306 for LV signals is as follows. LV signals propagate through the LV signal path which includes the inverter 504, the inverter 512, and the NMOS 1126. The output of the LV signal path is coupled to the WL 524.

For the HV signal path, the RNG 414 signal may be low for an operation (such as a program operation) to be performed on a selected sector. For an operation to be performed on a deselected sector, the RNG 414 signal may be high. The GWLB 412 signal may be high for the operation performed on the selected sector or the deselected sector. The NMOS 1126 for the operation performed on the selected sector is off while the NMOS 1126 for the operation performed on the deselected sector is on. For the program operation performed on the selected sector or the deselected sector, PMOS 1127 is off, NMOS 1120 is on, PMOS 1125 is off and NMOS 1121 is on. In the selected sector, VNEG_C_S 514 propagates to onto WL 524. In the deselected sector, ROW_OUT 522 propagates to onto WL 524. Details regarding the propagation of ROW_OUT 522 or VNEG_C_S 514 onto the WL 524 for the operation performed on the selected sector or deselected sector are described herein below.

The HV signal path in the WLDRV 306 for HV signals is as follows. HV signals propagate through the HV signal path which includes at least the inverter 512 and the NMOS 1126. Therefore, the portion of the HV signal path that is embedded within the LV signal path includes at least the inverter 512 and the NMOS 1126. However, when HV signals propagate through the HV signal path, for both the operation on the selected sector and deselected sector, ROW_OUT 522 (which is at the drain of both PMOS 1127 and NMOS 1120) is zero volts. The output of the HV signal path is coupled to the WL 524, via the NMOS 1121.

Described herein are details regarding operations received by the WLDRV 306 and outputs propagated on the WL 524 as a result of the operations. The operations may be for LV signals for a selected sector with an active word line for a read operation, LV signals for a deselected sector or selected sector where the word line is not selected for a read operations, HV signals for a selected sector for a program operation, and HV signals for a deselected sector for a program operation.

In an example, if a read operation is to be implemented for a selected sector with an active word line, the fast-LV signals may propagate on a fast-LV signal path. LV signals may be input into the WLDRV 306. The GWLB 412 signal, which is low, is received by the WLDRV 306 from the LV logic 408 in FIG. 4. The RNG 414 signal is high. As the RNG 414 signal is high, the NMOS 1126 is on. The GWLB 412 signal is coupled to each of the gates of the PMOS 1127 and the NMOS 1120. The PMOS 1127 is on and the NMOS 1120 is off. Therefore, the VBST 510 signal, which is at the source of the PMOS 1127, is coupled to the drain of the PMOS 1127. Thus, the output of the inverter 504 is the VBST 510 signal. ROW_OUT 522 is high/selected (and coupled to the VBST 510 signal). In the inverter 512, the PMOS 1125 is on and the NMOS 1121 is off. Therefore, the drain of PMOS 1125 is coupled to ROW_OUT 522, which propagates from the source of PMOS 1125. Thus, the output of the inverter 512 is ROW_OUT 522. Therefore, ROW_OUT 522 is propagated onto the WL 524 for the LV signal path. Thus, the WL 524 is the VBST 510 signal. In an implementation, the VBST 510 signal may be 2.5V. Details regarding the outputs propagated onto the WL 524 are described herein with respect to FIG. 10, table 1001. The voltage ranges of signals are described herein with respect to FIG. 10, table 1003.

In an example, if a read operation is to be implemented for a deselected sector or a selected sector where the word line is not selected, the fast-LV signals may propagate on a fast-LV signal path as follows. LV signals may be input into the WLDRV 306. The GWLB 412 signal, which is high, is received by the WLDRV 306 from the LV logic 408 in FIG. 4. The GWLB 412 signal is coupled to the inverter 504. The RNG 414 signal is high and therefore both the GLWB 412 and the RNG 414 signals are high. Thus, the PMOS 1127 is turned off and the NMOS 1120 in the inverter 504 is turned on. Thus, the output of the inverter 504, which propagates to ROW_OUT 522, is zero volts. Thus, ROW_OUT 522 is zero volts. In the inverter 512, VNEG_C_S 514 is at ground. The PMOS 1125 is off and the NMOS 1121 is off. The PMOS 1125 is off because its gate is zero volts and its source is also zero volts. The NMOS 1121 is off because its gate is zero volts and its source is also zero volts. Thus, the output of the inverter 512 is tri-stated. However, the NMOS 1126 is on because the RNG 414 signal at the gate of 1126 is high. ROW_OUT 522 (which is zero volts as determined by the output of the inverter 504) is propagated onto WL 524 for the HV signal path for the deselected sector or selected sector where a word line is not selected. Thus, the WL 524 is propagated by ROW_OUT 522 which is zero volts.

In an example, if a program operation is to be implemented for a selected sector, the slow-HV signals may propagate on a slow-HV signal path as follows. HV signals may be input into the WLDRV 306. The RNG 414 signal, which is low, is received by WLDRV 306 from the HV logic 410 in FIG. 4. In the HV signal path, the GLWB 412 signal is high and therefore, not selected and the RNG 414 signal is low. The RNG 414 signal is coupled to the gate of the NMOS 1126. The PMOS 1127 is off and the NMOS 1120 is on. Therefore, vgnd 506, which is at the source of NMOS 1120, is coupled to the drain of NMOS 1120. Thus, the output of the inverter 504 is vgnd 506 or ground (i.e., zero volts). The output of the inverter 504, ROW_OUT 522, is low (and coupled to vgnd 506 or is at zero volts). Thus, ROW_OUT 522 is zero volts. In the inverter 512, the PMOS 1125 is off and the NMOS 1121 is on. The PMOS 1125 is off because its gate to source is zero volts. The NMOS 1121 is on because its gate is zero volts and its source is a negative value. For example, the source, VNEG_C_S 514, may be −3.6V. Thus, the output of the inverter 512 is VNEG_C_S 514. Therefore, the drain of the NMOS 1121 is coupled to VNEG_C_S 514, which is at the source of the NMOS 1121. VNEG_C_S 514 will propagate on the WL 524. The NMOS 1126 is off because the RNG 414 signal at the gate of 1126 is at −3.6V (i.e., is at VNEG_C_S 514). VNEG_C_S 514, which is at the source of the NMOS 1126, is coupled to the drain of NMOS 1126. Therefore, VNEG_C_S 514 is propagated onto WL 524 for the HV signal path for the selected sector. In an implementation, VNEG_C_S 514 may be −3.6V.

In an implementation of an NVM device using CSL architecture, VNEG_C_S 514 is approximately at VNEG levels (e.g., −3.6V to −2.4V) during the program operation of the selected sector, which may help eliminate the leakage through a pass transistor. An example of a pass transistor 702 is described herein with respect to FIGS. 7A-9B.

In an implementation, during program, the source of PMOS 1125 is pulled to ground, as ROW_OUT 522 from the previous inverter 504 is pulled to ground. This may provide protection during program from SOA, so the HV signal path may be SOA error free. The transistors in the first and second path comply with the SOA requirements for the transistors.

In an example, if a program operation is to be implemented for a deselected sector, the slow-HV signals may propagate on a slow-HV signal path as follows. HV signals may be input into the WLDRV 306. The RNG 414 signal, which is high, is received by WLDRV 306 from the HV logic 410 in FIG. 4. In the HV signal path, the GLWB 412 signal is also high and therefore, not selected and the RNG 414 signal is also high. The RNG 414 signal is coupled to the gate of the NMOS 1126. As the GLWB 412 signal is high and therefore, not selected, the PMOS 1127 is turned off and the NMOS 1120 in the inverter 504 is turned on. Thus, the output of the inverter 504 is zero volts. Thus, ROW_OUT 522 is zero volts. In the inverter 512, VNEG_C_S 514 is at ground voltage in a deselected sector. The PMOS 1125 is off and the NMOS 1121 is off. The PMOS 1125 is off because its gate is zero volts and its source is zero volts. The drain of the NMOS 1121 is at vgnd level or zero volts. Thus, the output of the inverter 512 is tri-stated. The NMOS 1126 is on because the RNG 414 signal at the gate of 1126 is high. ROW_OUT 522 (which is zero volts as determined by the output of the inverter 504) is propagated onto WL 524 for the HV signal path for the deselected sector. In an implementation, ROW_OUT 522 may be zero volts.

In an implementation, when a signal is referred to as being "high", the signal may have a value of logic "1". When a signal is referred to as being "low", the signal may have a value of logic "0". For example, the GWLB 412 signal and the RNG 414 signal may be referred to as being "high" or "low." A "high" signal and a "low" signal may be represented as a binary number and differ from a high voltage (HV) signal and a low (LV) signal, as defined above.

In an implementation, by embedding at least a portion of the path of the HV signals unto the path of the LV signals in the WLDRV 306, the WLDRV 306 may achieve a speed that is optimal for both read and program paths. For example, the WLDRV 306 may achieve a speed of less than two nano-seconds during read. In the LV path, the WLDRV 306 may include properly sized devices to toggle the GWLB 412 signal between the VBST 510 signal and the vgnd 506 signal, in the inverter 504. The toggling may be less than two nanoseconds during read. Therefore, the fast-LV signal reads the NVM cell, the slow-HV signal programs the NVM cell.

In an implementation, for the HV signal path, during a program operation, the WLDRV 306 propagates on the WL 524, VNEG_C_S 514, so that for a selected sector, leakage from the pass transistor may be reduced or eliminated.

During an erase operation, for the selected sector, selected row and deselected row and for the deselected sector, the vpwr is propagated to the WL 524. Details regarding various operations and voltages propagated for WL 524 are shown herein with respect to FIG. 10.

As described above with respect to FIG. 3, GWLDRV 302 controls multiple WLDRV 306. In the depicted embodiment, GWLDRV 302 controls four WLDRV 306. Each of the WLDRV 306 may have common inputs, however, the outputs of each WLDRV 306 are independent of each other. The GWLDRV 302 is thus coupled to a first WLDRV 306, a second WLDRV 306, a third WLDRV 306, and a fourth WLDRV 306 for each sector and the GWLDRV 302 controls each (first, second, third, and fourth) WLDRV 306. In FIG. 5, one WLDRV 306 is shown. However, a second WLDRV 306 may include similar components as the first WLDRV 306 depicted in FIG. 5.

FIG. 6 is a flow diagram illustrating a high voltage (HV) signal path that is embedded within a low voltage (LV) signal path, according to one embodiment. Each of the HV or LV signals may be generated (by LV logic 408 or HV logic 410 in FIG. 4) to perform an operation. The operations may include, for example, an erase operation, a program operation, or a read operation. It should be appreciated that only some of the voltage signals are described for a read and program operation. Additional voltage signals for each operation are described in regards to FIGS. 10 and 11. Method 600 may be performed by the WLDRV 306 in memory array 112, as shown in FIGS. 1, 2, 3, and/or 5 and WLDRV 306 may perform some or all the operations described herein.

Method 600 begins at block 610 where the WLDRV 306 receives a first input signal for a first path and a second input signal for as second path, where the first and second input signals are to perform an operation on a NVM cell of a NVM device 102. The operation may be one of an erase operation, program operation, or read operation.

Method 600 continues to block 620, where the WLDRV 306 propagates the first input signal to the first path. The WLDRV 306 may propagate the first input signal (GWLB 412) to the first path (LV path).

Method 600 continues to block 630, where the WLDRV 306 propagates the second input signal to the second path, where at least a portion of the second path is embedded within the first path. The WLDRV 306 may propagate the second input signal (RNG 414) to the second path (HV path).

The first path (e.g., the LV path) includes the inverter 504, the inverter 512 and NMOS 1126. The second path (e.g., the HV path) includes the inverter 512. At least the portion of the second path that is embedded within the first path includes the NMOS 1126 and/or the inverter 512.

Method 600 continues to block 640, where the WLDRV 306 outputs to a word line a first output signal generated in view of the first input signal propagated on the first path. The WLDRV 306 outputs to WL 524, ROW_OUT 522 generated in view of the GWLB 412 signal propagated on the LV path.

Method 600 continues to block 650, where the WLDRV 306 outputs to the word line, a second output signal generated in view of the second input signal propagated on the second path. The WLDRV 306 outputs to WL 524, VNEG_C_S 514 generated in view of the RNG 414 signal propagated on the HV path.

In an implementation, transistors in the first path and in the second path comply with safe operating area (SOA) requirements for transistors.

FIG. 7A illustrates a selected sector of a non-volatile memory array during an erase operation, according to one embodiment. NVM sector 700 illustrates the various bias voltage levels applied to a selected sector during an erase operation. A selected sector may be a sector of a memory array selected for a particular operation, in this case for an erase operation. During an erase operation, one or more rows of NVM cells of a sector may be erased to read a logical "0". Also during an erase operation, one or more rows of NVM cells of a selected sector may not be erased (e.g., deselected row of selected sector).

NVM sector 700 contains two rows, a first row containing NVM cell 701 and a second row containing NVM cell 704. NVM sector 700 contains one column. NVM sector 700 also contains sector select circuit 140 for the column. Each column of a multi-column NVM sector may have a sector select circuit. Sector select circuit 140 includes three transistors 741, 742, 743. It should be appreciated that for purposes of illustration, and not for limitation, NVM sector 700 is shown with two rows and one column. An NVM sector may include the same, more, or less rows and the same or more columns than illustrated in FIG. 7A. It should also be appreciated that for purposes of illustration, and not for limitation, sector select circuit 140 is shown as part of an NVM sector 700. In another example, sector select circuit 140 may not be part of NVM sector 700.

NVM sector 700 illustrates multiple horizontal (row) signal lines and multiple vertical (column) signal lines. Horizontal signal lines include lines 730 (PSB), 731 (WLS), 732 (WL), 733 (WLS), 734 (WL), 735 (NS), 736 (CL), and 737 (Y). Vertical signal lines include 738 (BL) and 739 (GBL). Another signal line, the common source line (CSL) 740, is shared by all the NVM cells in NVM sector 700, including NVM cell 701 and NVM 704 and additional columns and rows of NVM cells (not shown) of the NVM sector 700. It should be appreciated that the voltages applied to the signal lines, as illustrated in FIG. 7A through FIG. 9B, may be electrically coupled to, applied by, controlled by, and/or sourced by high voltage control circuitry 126 of FIG. 1.

For purposes of illustration, and not for limitation, the external power supply of NVM sector 700 is 0V to 1.2V. The high voltage rail (i.e., 1.2V) may vary from 0.9V to 1.32V under certain conditions. It should be appreciated that the external power supply 150 of the NVM sector 700 may be any voltage range or may be dependent on the particular technology node. Also as illustrated, multiple HV signals may be applied to NVM sector 700 to perform the erase operation. For example, WLS 731 is at −3.6V, CSL 740 at 4.7V, BL is at 4.7V, SPW is at 4.7V, etc. It should be appreciated that high voltage control circuitry 126 controls the application of the various HV signals (and LV signals) so as to keep the transistors of the NVM sector 700 in SOA.

NVM sector 700 includes multiple transistors. The transistor of NVM sector 700 may be 4-terminal transistors including a gate, source, drain, and bulk. NVM cell 701 and NVM cell 704 are 2T memory cells including a pass transistor (i.e., 702 and 705) and a memory transistor (703 and 706). Pass transistors 702 and 705 may be N-channel metal oxide semiconductor field-effect transistors (nMOSFET) where the source of the pass transistors is coupled to CSL 740.

The memory transistors 703 and 706 may be NVM transistors, such as charge trapping memory transistors. Memory transistors 703 and 706 are illustrated having a shaded oxide layer as the gate. The drains of memory transistors 703 and 706 are coupled to BL 738. The pass transistors, such as pass transistors 702 and 705, and the transistors of sector select circuit 140 usually of a lower SOA than the memory transistors. The HV signals used for the operation of the memory transistors may exceed the SOA for at least the aforementioned transistors.

Sector select circuit 140 includes three transistors. Transistor 741 is P-channel metal oxide semiconductor field-effect transistor (pMOSFET) where the drain is coupled to GBL 739 and the source is coupled to BL 738. Transistor 742 is an nMOSFET where the drain is coupled to GBL 739 and where the source is coupled to BL 738. Transistor 743 is an nMOSFET where the drain is coupled to BL 738, the gate is coupled to Y 737, and where the source is coupled to CL 736. During an erase operation of a selected sector, transistor 741 of sector select circuit 140 is switched to on so that the voltage signal on GBL 739 is coupled to BL 738.

In one embodiment, the transistors of sector select circuit 140 are extended drain transistors. Extended drain transistors have an additional implant (either an N-type dopant for an nMOSFET or a P-type dopant for pMOSFET) in the drain making the drain longer and the transistor no longer symmetrical. Extended drain transistors may be illustrated by having a rectangle located in the drain of the transistor, as illustrated in FIG. 7A. An extended drain transistor may be able to withstand a higher voltage differential (than a non-extended drain transistor) between the terminals of extended drain transistor, when the transistor is off. For example, an extended drain 5V transistor (DE5) or an extended drain 9V transistor (DE9) may withstand voltages of 5V or 9V, respectively, between the drain and source, the gate and drain, but not between the gate and source. A MOSFET without an extended drain, such as pass transistor 702 and 705, may only be able to withstand a voltage differential of roughly 3.6V between any of the transistor's terminals, for example. An extended drain transistor may have a higher SOA when off because the extended drain transistor may be able to withstand higher voltage differentials across particular terminals, as described above. However when turned on, the extended drain transistor may have an SOA with lower voltage differentials (e.g., 3.6V).

In another embodiment, one or more of the transistors of sector select circuit 140 may be implemented using cascoded transistors biased to protect the circuit for overvoltage stress while maintaining SOA. In still another embodiment, the transistors of sector select circuit 140 may be implemented using transistors using a thicker gate oxide capable of supporting high direct voltages, such as 4.7V. Transistors using a thicker gate oxide may be implemented with a process using a third gate oxide. However this would require a more complicated technology which would allow a third gate oxide layer.

During an erase operation to erase a memory cell of a row of a selected sector, an HV signal of 4.7V is applied to CSL 740 by high voltage control circuitry 126. The HV signal of 4.7V is above the 1.2V high-rail of the power supply, such as external power supply 150. Also during the erase operation, the gate of memory transistor 703 is coupled to WLS and a voltage potential of −3.6V, which is below the 0V low-rail of the ground supply. The voltage differential between the gate relative the bulk of memory transistor 703 is at a −8.3V, which causes holes to be injected from the channel into the charge trapping layer of memory transistor 703. The erase of memory transistor 703 causes memory cell 701 to read a logical "0." During the erase operation, NVM cell 704 is not erased as the row has been deselected and the voltage between the gate and bulk of memory transistor 706 is 0V.

It should be appreciated that some of the different voltage levels and electrical connections illustrated in FIGS. 7A through 9B may not be described herein. A person of reasonable skill in the art would be able to determine the different voltage levels and electrical connections in view of the Figures herein, in particular FIGS. 7A through 9B. Further, it should also be appreciated that, apart from the relative voltage levels of different signal lines, the description with respect to FIG. 7A applies to FIGS. 7B through 9B, unless otherwise described.

FIG. 7B illustrates a deselected sector of a non-volatile memory array during an erase operation, according to one embodiment. During an erase operation on a deselected sector, the NVM memory cells of the deselected sector are not erased. As illustrated, the voltage differential between the gate to bulk, gate to drain and gate to source for memory transistor 703 and 706 are at 0V, which does not materially alter the charge distribution in the charge trapping layer of the memory transistor 703 and 706.

FIG. 8A illustrates a selected sector of a non-volatile memory array during a program operation, according to one embodiment. During a program operation on a selected sector 800, one or more NVM cells of a selected row may be programmed to a logical "1" while the remaining NVM cells on the selected row may be inhibited from being programmed and remain erased. The NVM cells of deselected rows may be prevented from changing previously stored data values. A write operation may include both an erase operation and a program operation.

In NVM sector 800, NVM cell 701 is illustrated as being a selected row and being programmed or inhibited during a program operation. During programming mode, to program NVM cell 701, sector select circuit 140 controls the voltage on BL 738 to be −3.6V. During programming mode, to inhibit NVM cell 701, sector select circuit 140 controls the voltage of BL 738 to be 1.2V. Inhibit refers to preventing an erased NVM cell (e.g., logical "0") from becoming programmed (e.g., logical "1") during a program operation. NVM cell 704 is illustrated as being a deselected row during a program operation.

During a program operation to program NVM cell 701, an HV signal of 4.7V is applied to WLS 731 which is coupled to the gate of memory transistor 703. GBL 739 is coupled to HV signal of −3.6V and transistor 742 of sector select circuit 140 turns on to couple the −3.6V on the GLB 739 to BL 738. The voltage across the gate relative the bulk and drain of memory transistor 703 is 8.3V. The 8.3V differential injects electrons from the channel of memory transistor 703 into the charge trapping layer which causes memory transistor 703 to be programmed to a logical "1." Also during the program operation to program NVM cell 701, an HV signal of −3.6V is applied to WL 732 which is coupled to the gate of pass transistor 702. An HV signal of −2.4V is applied to CSL 740 which is coupled to the source of pass transistor 702.

During the program operation, NVM cell 701 may be inhibited rather than programmed. To inhibit NVM cell 701 during a program operation, sector select circuit 140 opens (i.e., transistor 741 is turned on) which couples a voltage signal of 1.2V from GBL 739 to BL 738. It should be appreciated that high voltage control circuitry 126 applies the either −3.6V or 1.2V to GBL 739 dependent on the determination of whether to program or inhibit NVM cell 701.

FIG. 8B illustrates a deselected sector of a non-volatile memory array during a program operation, according to another embodiment. During program operation on a deselected sector, the NMV memory cells of the deselected sector are not programmed and the data values remain unchanged. As illustrated, the voltage differentials between the gate and bulk of memory transistor 703 and 706 are at zero volts, which does not materially alter the charge distribution in the charge trapping layer of the memory transistor 703 and 706.

Figures 9A, 9B:
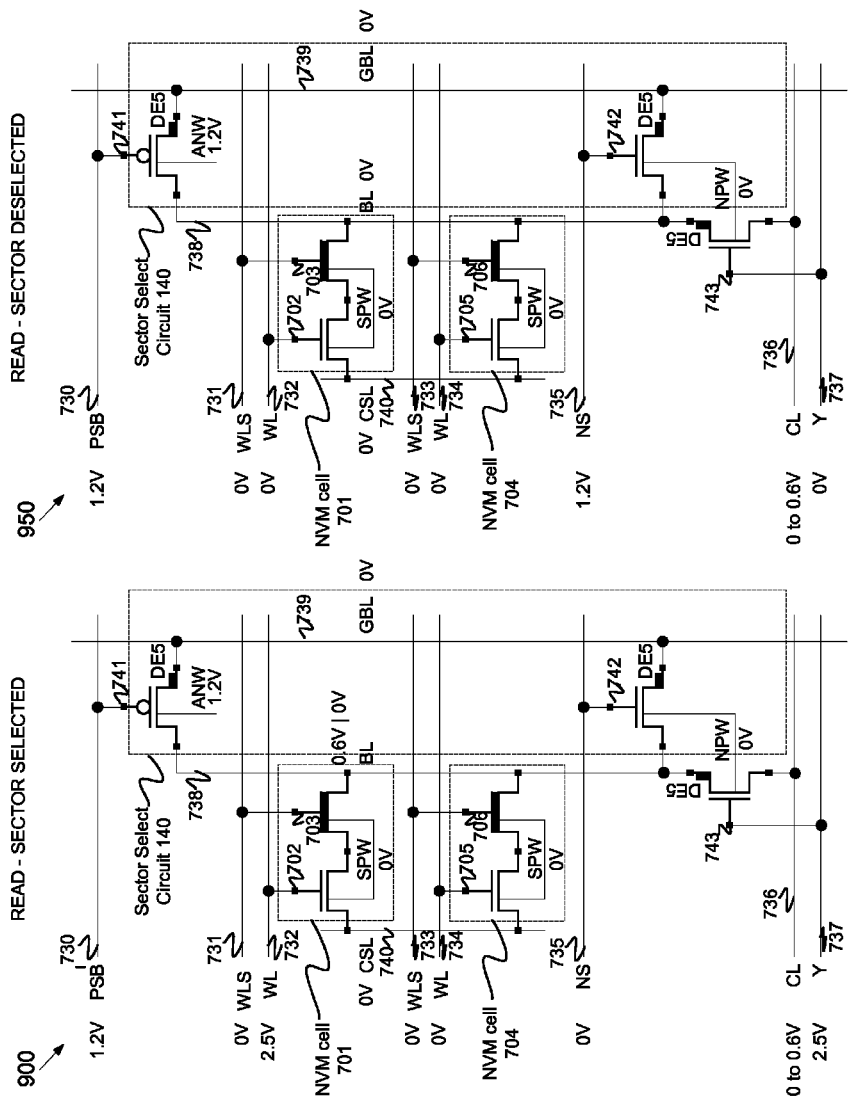
FIG. 9A illustrates a selected sector of a non-volatile memory array during a read operation, according to one embodiment.
FIG. 9B illustrates a deselected sector of a non-volatile memory array during a read operation, according to another embodiment.

FIG. 9A illustrates a selected sector of a non-volatile memory array during a read operation, according to one embodiment. During a read operation of a selected sector, the logical values of one or more NVM cells may be read. During a read operation of a selected sector, the gates of the memory transistors 703 and 706 may be grounded. An erased memory transistor may have a current flow during the read operation. The current is sensed by sense amplifiers 122, which registers a logical "0" for the particular NVM cell. A programmed transistor has substantially no current flowing during a read operation. Sense amplifiers 122 will sense substantially no current from the programmed NVM cell and register a logical "1" for the particular NVM cell.

During the read operation of NVM cell 701, an HV signal of 2.5V may be applied to WL 732 and coupled to the gate of pass transistor 702, while 0V may be applied to CSL 740. 0V may also be applied to WLS 731 coupled to the gate of memory transistor 703. Sector select circuit 140 turns on transistor 743, by applying an HV signal of 2.5V to signal line Y 737. Transistor 743 opens which allows current to flow to CL 736 and be sensed by sense amplifiers 122. Voltage on BL 738 may fluctuate from 0V to 0.6V, depending on whether the read NVM cell is a logical "0" or "1."

FIG. 9B illustrates a deselected sector of a non-volatile memory array during a read operation, according to another embodiment. No NVM cells are read from a deselected sector during a read operation.

FIG. 10 are tables illustrating voltage biases for erase, program, and read operations performed on a non-volatile memory device, according to one embodiment. Table 1001 illustrates the row-based voltage signals and the associated signal lines for memory array 112 using CSL architecture. Table 1001 provides the voltage signals for different operations, such as an erase operation, program operation, and read operation, to be provided to a selected row of a selected sector, a deselected row of a deselected sector, and the rows of a deselected sector. Table 1002 illustrates column-based voltage signals and the associated signal lines for memory array 112 using CSL architecture. Table 1002 provides the voltage signals for different operations, such as an erase operation, program operation, and read operation. In regards to an erase operation, table 1002 proves voltage signals for columns of a selected sector and deselected sector. In regards to a program operation, table 1002 provides voltage signals for a column of a selected sector that is to be programmed or inhibited, and a column of a deselected sector. In regards to a read operation, table 1002 provides voltage signals for a selected column of a selected sector, a deselected column of a selected sector, and columns of a deselected sector. Table 1003 illustrates the various voltage ranges of the voltage signals provided in the preceding tables. It should be appreciated that the voltage ranges are provided for illustration, rather than limitation, and that different voltage ranges be used. In addition, tables 1001, 1002, 1003 illustrate a table form of at least some of the voltage signals illustrated with respect FIGS. 7A through 9B.

FIG. 11 are tables illustrating voltage biases for positive margin read, negative margin read, and read operations performed on a non-volatile memory device, according to one embodiment.

Table 1101 illustrates the row-based voltage signals and the associated signal lines for memory array 112 using CSL architecture. Table 1101 provides the voltage signals for different operations, such as a positive margin read operation, negative margin read operation, and read operation, to be provided to a selected row of a selected sector, a deselected row of a selected sector, and the rows of a deselected sector. Margin mode read (e.g., positive or negative) may be a read operation during which a VMARG value is applied on a gate of a transistor (e.g., a SONOS transistor) in order to measure the VTe or VTp of the transistor device. Table 1102 illustrates column-based voltage signals and the associated signal lines for memory array 112 using CSL architecture. Table 1102 provides the voltage signals for different operations, such as a positive margin read, negative margin read, and read operation, to be provided to a selected column of a selected sector, a deselected column of a selected sector, and the columns of a deselected sector. Table 1103 illustrates the various voltage ranges of the voltage signals provided in the preceding tables. It should be appreciated that the voltage ranges are provided for illustration, rather than limitation, and that different voltage ranges be used. In addition, tables 1101, 1102, and 1103 illustrate a table form of at least some of the voltage signals illustrated with respect FIG. 5.

Figure 12:
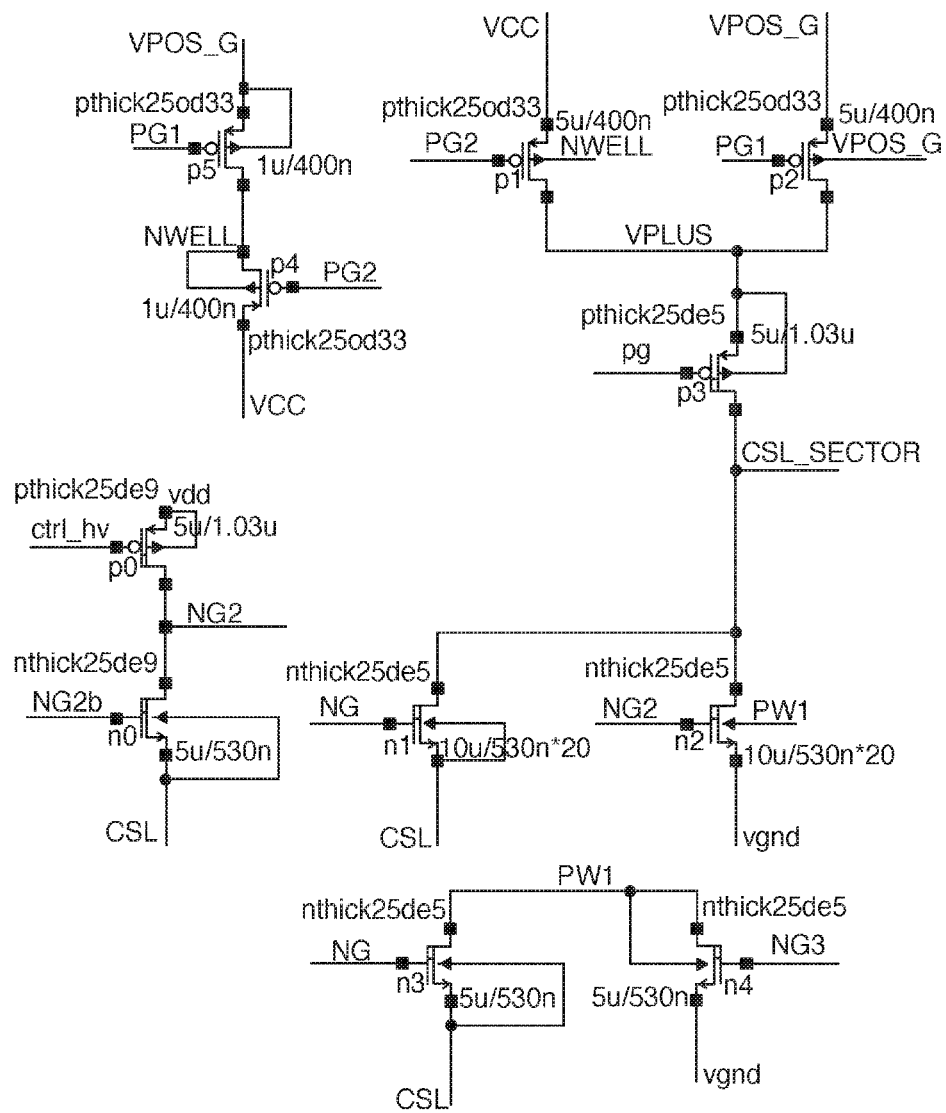
FIG. 12 is a circuit schematic of common source line driver, according to an embodiment.

FIG. 12 is a circuit schematic of common source line driver, according to an embodiment. Circuit 1200 is described herein with respect to the tables in FIG. 10. Based on the bias levels shown in table 1001 in FIG. 10, the signal CSL needs to be at VPOS during erase (up to 4.7V). Device N2 in circuit 1200 may be a DE5 device to meet the SOA requirements. In an implementation, if device N2 is to be driven by a Vpwr based signal (e.g., 0.9-1.32V), its width may be ten times larger in order to achieve less than 20 mV VDS drop under a 0.5 mA current. Therefore, the N2 device may be driven by a VDD signal. The gate of the N2 device, the signal labeled NG2, may be at VDD levels (e.g., 1.6-3.6V) during read operation, at vgnd during erase, or at CSL (e.g., around −2.4V) during program.

Other positive HV level shifters may take the Vpwr based control signal (e.g., in the 0/1.2V range) to vlo/VPOS (e.g., in the 1.2/4.7V range). The positive HV level shifter may take the Vpwr based control signal (e.g., in the 0/1.2V range) either to a first voltage (e.g., in the 0/1.6-3.6V range) during read or to vgnd (e.g., 0V) during erase and CSL=VNEG3 (−2.8V-2.1V) during program operation.

Figure 13:
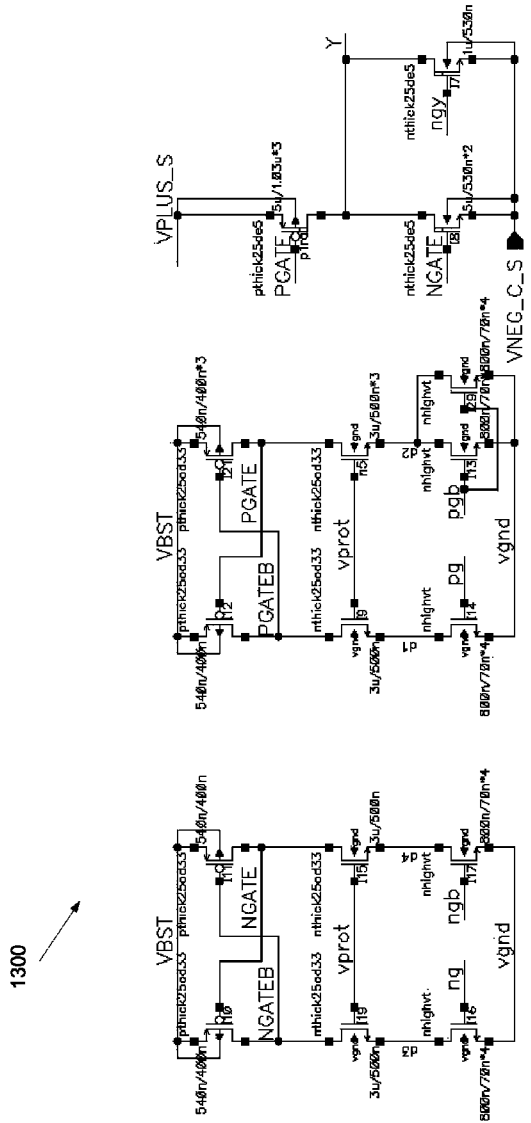
FIG. 13 is a circuit schematic of a column driver circuit, according to one embodiment.

FIG. 13 is a circuit schematic of a column driver circuit, according to one embodiment. In circuit 1300, a column select signal Y may need to switch quickly (fast) during read operation in order to select/deselect the proper columns. By changing the polarity of the column select signal to Y, the need for a negative boosting circuit may be eliminated. The column select may use the same positive boost level as the wordline driver: VBST, therefore the NGATE and PGATE signals which may drive the inverter p1ra/I8 are level shifted at VBST level for fast access (<2 ns) during read.

In an implementation, a secondary access path may realized through I7 for which the signal ngy biased at vhi levels, allowing to pass VNEG_C_S during program.

In an implementation, during an erase operation, for deselected sectors, the signal VPLUS_S gets VPOS levels and may allow the required VPOS (in table 1001 in FIG. 10) to be brought on the Y lines.

In an implementation, the HV Level shifters may use a latch structure and the two branches of the latch can be made asymmetrical in order to increase the speed while keeping the area small. The right branches driving PGATE and NGATE used to further drive signal Y are three times larger than the left branches. In an implementation, the circuit on the left and the middle may be referred to as level shifters. In the implementation of FIG. 13, a distributed driver may not be needed.

Figure 14:
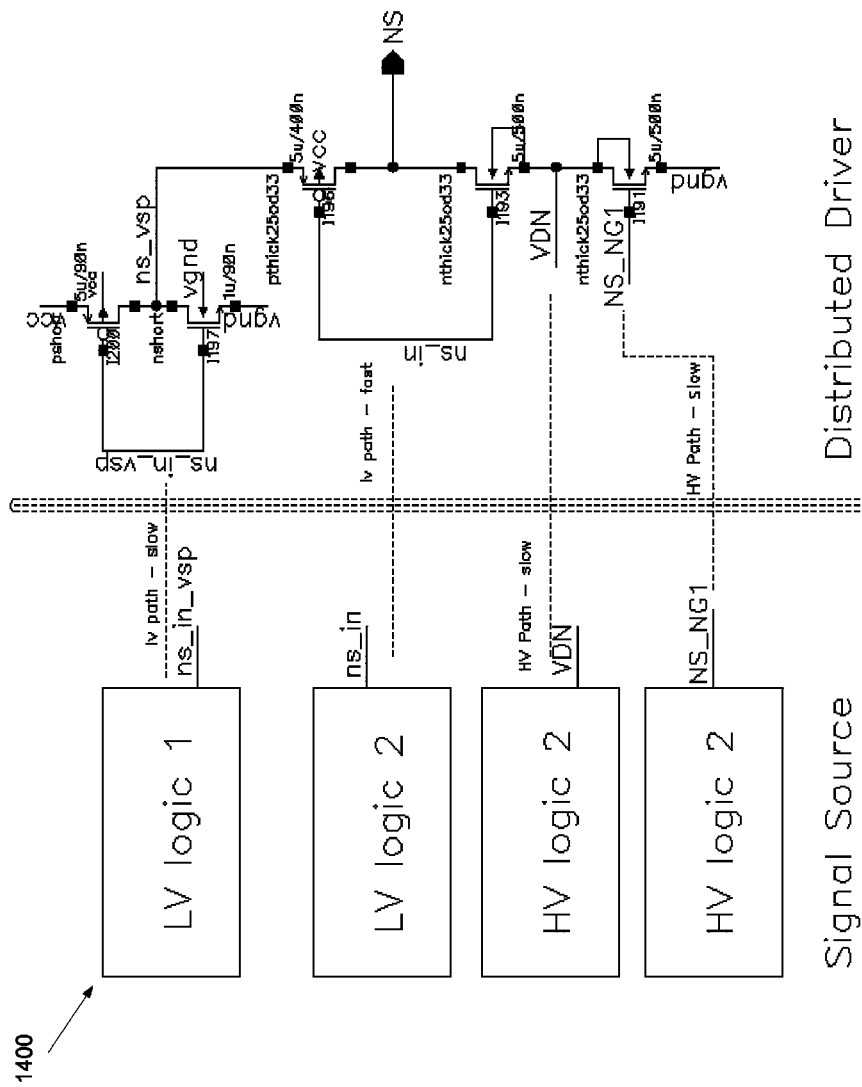
FIG. 14 is a circuit schematic of an NS distributed driver and a signal source, according to another embodiment.

FIG. 14 is a circuit schematic of an NS distributed driver and a signal source, according to another embodiment. In circuit 1400, the NS distributed driver (on the right) is another cell for which a HV path was embedded into a LV path. The devices biased by signal NS are ON for the deselected sectors in order to keep BL at vgnd level via the GBL signal. When accessing the sector for read, NS needs to be deselected so the memory cell can be connected to the Bitline (see table 1102 in FIG. 11).

For NS, a split architecture is depicted in which a source section partly decodes LV and HV signals followed by a distributed driver to achieve a particular speed (<2 ns from ssel switch to NS at the cell).

In an implementation, the LV path may use properly sized devices in order to be able to toggle the ns_in, where the NS signal may be between vcc and vgnd levels in less than 2 ns. Three different signals (ns_in_vsp, VDN and NS_NG1) may be needed to provide the biases for the HV path (slow): VHI or VNEG during a program operation and VLO during an erase operation.

The ns_in, ns_in_vsp, VDN and NS_NG1 signals may drive a distributed NS driver placed within the memory array on the same pitch with WLDRV block 306 (in FIG. 2). In an implementation, by reducing the load driven by each distributed driver, a speed improvement may be achieved when compared to a single point placed driver.

Figure 15:
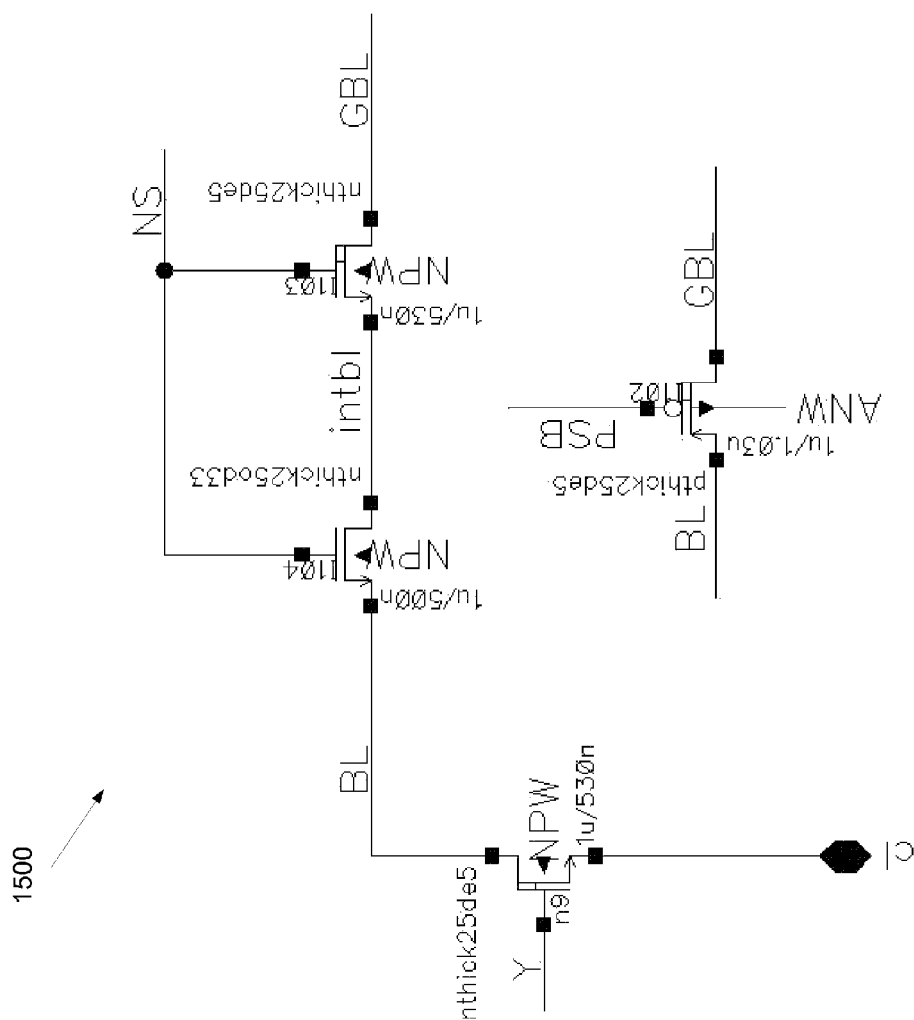
FIG. 15 is a circuit schematic for an SSEL biasing block, according to another embodiment.

FIG. 15 is a circuit schematic for an SSEL biasing block, according to another embodiment. Circuit 1500 may use a larger equivalent device, as compared to other devices, to connect between BL and CL to improve the read time and a longer equivalent device to reduce the GBL-BL leakage for the unselected blocks. This may help minimize the current which may be delivered by the negative pump (VNEG), leading to a smaller area for the flash macro. In an implementation, a larger width provides for more drive capabilities and less voltage drop.

In an implementation, the circuit 1500 can share the same positive boosted signal used by WL (VBST). The mix of the HV (slow) paths into the read (fast) paths may be used in other HV applications. Thus, the paths not tied to the NV type memories.

In an implementation, by embedding the HV (slow) path within the LV (fast) read path, while maintaining the SOA reliability requirements, a CSL SONOS memory cell may be used. The CSL SONOS memory cell is 32% smaller than the DSL version for a same or similar technology node.

Embodiments of the present invention include various operations described herein. These operations may be performed by hardware components, software, firmware, or a combination thereof.

Certain embodiments may be implemented as a computer program product that may include instructions stored on a non-transitory machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A circuit comprising:
   a word line coupled to a non-volatile memory (NVM) cell;
   a first path comprising a first inverter and a transistor, the transistor coupled to the word line, the first path coupled to receive a first input voltage signal; and
   a second path, wherein at least a portion of the second path is embedded within the first path, wherein the portion of the second path comprises the transistor coupled to the word line, the second path coupled to receive a second input voltage signal, wherein the first input voltage signal is a fast-low-voltage signal that reads the NVM cell, and wherein the second input voltage signal is a slow-high-voltage signal that programs the NVM cell.

2. The circuit of claim 1, wherein the portion of the second path embedded within the first path further comprises a second inverter.

3. The circuit of claim 2, wherein each of the first inverter and the second inverter comprises a respective pair of metal-oxide-semiconductor field-effect transistors (MOSFETs).

4. The circuit of claim 2, wherein:
the transistor comprises a first metal-oxide-semiconductor field-effect transistor (MOSFET) comprising a first gate, a first well, a first source, and a first drain;
the first inverter comprises:
  a second MOSFET comprising a second gate, a second well, a second source, and a second drain coupled to the first drain, and
  a third MOSFET comprising a third gate coupled to the second gate, a third well, a third source, and a third drain coupled to the second drain and the first drain;
the second inverter comprises:
  a fourth MOSFET comprising a fourth gate, a fourth well, a fourth source, and a fourth drain coupled to the first source and to the word line, and
  a fifth MOSFET comprising a fifth gate, a fifth well, a fifth source coupled to the first drain, the second drain, and the third drain, and a fifth drain coupled to the first source and to the word line;
wherein the first, second, and fourth MOSFETs each comprises an N-channel MOSFET (NMOS), and wherein the third and fifth MOSFETs each comprises a P-channel MOSFET (PMOS).

5. The circuit of claim 1, further comprising:
a global word line driver (GWLDRV) coupled to, and controlling the word line, the first path, the second path, a second word line, a third path and a fourth path;
the second word line coupled to a second non-volatile memory (NVM) cell;
the third path comprising a second inverter and a second transistor, the second transistor coupled to the second word line, the third path coupled to receive the first input voltage signal; and
the fourth path comprising at least the second transistor coupled to the second word line, wherein at least a portion of the fourth path is embedded within the third path, the fourth path coupled to receive the second input voltage signal.

6. A non-volatile memory (NVM) device comprising:
a plurality of cells;
a global word line driver (GWLDRV);
a plurality of distributed word line drivers coupled to GWLDRV, the plurality of distributed word line drivers comprising at least a first distributed word line driver coupled to a word line that is coupled to a first cell of the plurality of cells, wherein the first distributed word line driver comprises:
a first input;
a second input;
a first path, coupled to the first input, the first path comprising a first inverter, wherein an output of the first path is coupled to the word line; and
a second path, coupled to the second input, the second path comprising a transistor coupled to the word line, wherein at least a portion of the second path is embedded within the first path,
wherein the GWLDRV further comprises low-voltage (LV) logic coupled to the first input of the first distributed word line driver and high-voltage (HV) logic coupled to the second input of the first distributed word line driver.

7. The NVM device of claim 6, wherein the portion of the second path embedded within the first path comprises at least one of the transistor or a second inverter.

8. The NVM device of claim 6, wherein the GWLDRV further comprises a row logic decoder, a level shifter coupled to the LV logic and the row logic decoder, and a high-voltage signal control circuitry coupled to the HV logic, wherein the row logic decoder is configured to output LV signals to the LV logic, via the level shifter and wherein the high voltage signal control circuitry is configured to output HV signals to the HV logic.

9. The NVM device of claim 8, wherein a gate of the transistor is coupled to the HV logic via the second input, wherein the first inverter comprises a pair of transistors, a gate of each of the pair of transistors coupled to the LV logic via the first input, wherein a source of a first of the pair of transistors is coupled to a first voltage potential (VBST) and a second of the pair of transistors is coupled to a second voltage potential (vgnd), and wherein a drain of each of the pair of transistors is coupled to a node (ROW_OUT), the node being coupled to a drain of the transistor, wherein a source of the transistor is coupled to the word line, and wherein the source of the transistor is also coupled to drains of a second pair of transistors of a second inverter, a source of a first of the second pair of transistors being coupled to the node and a source of a second of the second pair of transistors being coupled to a third voltage potential (VNEG_C_S).

10. The NVM device of claim 9, wherein, for a read operation on a selected sector of a row of the NVM device, the row logic decoder is configured to output a signal to the first distributed word line driver, via the level shifter and the LV logic, wherein the first path is configured to receive the signal, and wherein the first path is configured to output a ROW_OUT signal on the word line.

11. The NVM device of claim 9, wherein for a program operation on a selected sector of a row of the NVM device, the high voltage signal control circuitry is configured to output a signal to the first distributed word line driver, via the HV logic, wherein the second path is configured to receive the signal, and wherein the second path is configured to output a VNEG_C_S signal on the word line.

12. The NVM device of claim 6, wherein:
the transistor comprises a first metal-oxide-semiconductor field-effect transistor (MOSFET) comprising a first gate, a first well, a first source, and a first drain;
the first inverter comprises:
  a second MOSFET comprising a second gate, a second well, a second source, and a second drain coupled to the first drain, and
  a third MOSFET comprising a third gate coupled to the second gate, a third well, a third source, and a third drain coupled to the second drain and the first drain;
the NVM device further comprising:
  a second inverter comprising:
    a fourth MOSFET comprising a fourth gate, a fourth well, a fourth source, and a fourth drain coupled to the first source and to the word line, and
    a fifth MOSFET comprising a fifth gate, a fifth well, a fifth source coupled to the first drain, the second drain, and the third drain, and a fifth drain coupled to the first source and to the word line;
wherein the first, second, and fourth MOSFETs each comprises an N-channel MOSFET (NMOS), and wherein the third and fifth MOSFETs each comprises a P-channel MOSFET (PMOS).

13. The NVM device of claim 6, wherein the plurality of distributed word line drivers further comprises:
a second distributed word line driver coupled to a second word line that is coupled to a second cell of the plurality of cells, wherein the second word line driver comprises:
a third path, coupled to the first input, the third path comprising a second inverter, wherein an output of the third path is coupled to the second word line; and
a fourth path, coupled to the second input, the fourth path comprising a second transistor coupled to the second word line, wherein at least a portion of the fourth path is embedded within the third path.

14. A method comprising:
receiving, at a first distributed word line driver, a first input signal for a first path and a second input signal for a second path, the first and second input signals to perform an operation on a non-volatile memory (NVM) cell of an NVM device, wherein the first path comprises a first inverter, a second inverter, and a transistor and the second path comprises the second inverter, and wherein a portion of the second path embedded within the first path comprises at least the second inverter;
propagating, by the first distributed word line driver, the first input signal to the first path;
propagating, by the first distributed word line driver, the second input signal to the second path, wherein at least a portion of the second path is embedded within the first path;
outputting, by the first distributed word line driver, to a word line, a first output signal generated in view of the first input signal propagated on the first path; and
outputting, by the first distributed word line driver, to the word line, a second output signal generated in view of the second input signal propagated on the second path.

15. The method of claim 14, wherein the portion of the second path embedded within the first path further comprises the transistor.

16. The method of claim 14, wherein the first input signal comprises a voltage below a highest voltage of an external power supply and at or above a lowest voltage of the external power supply.

17. The method of claim 14, wherein the first distributed word line driver is coupled to a global word line driver (GWLDRV) and wherein the GWLDRV is also coupled to a second distributed word line driver, the GWLDRV controlling the first distributed word line driver and the second distributed word line driver, the method further comprising:
receiving, at the second distributed word line driver, the first input signal for a third path and the second input signal for a fourth path, the first and second input signals to perform an operation on a second NVM cell of the NVM device;
propagating, by the second distributed word line driver, the first input signal to the third path;
propagating, by the second distributed word line driver, the second input signal to the fourth path, where at least a portion of the fourth path is embedded within the third path;
outputting, by the second distributed word line driver, to a second word line, a third output signal generated in view of the first input signal propagated on the third path; and
outputting, by the second distributed word line driver, to the second word line, a fourth output signal generated in view of the second input signal propagated on the fourth path.

* * * * *